(12) United States Patent
Jang

(10) Patent No.: US 12,078,896 B2
(45) Date of Patent: Sep. 3, 2024

(54) TECHNIQUES FOR COMPLEX WAVEFRONT MODULATION

(71) Applicant: META PLATFORMS, INC., Menlo Park, CA (US)

(72) Inventor: Changwon Jang, Kirkland, WA (US)

(73) Assignee: Meta Platforms, Inc., Menlo Park, CA (US)

(*) Notice: Subject to any disclaimer, the term of this patent is extended or adjusted under 35 U.S.C. 154(b) by 0 days.

(21) Appl. No.: 18/162,615

(22) Filed: Jan. 31, 2023

(65) Prior Publication Data

US 2023/0168548 A1 Jun. 1, 2023

Related U.S. Application Data

(62) Division of application No. 17/162,060, filed on Jan. 29, 2021, now Pat. No. 11,567,375.

(51) Int. Cl.
*G02F 1/1347* (2006.01)
*G02F 1/1335* (2006.01)
(Continued)

(52) U.S. Cl.
CPC .... *G02F 1/13471* (2013.01); *G02F 1/133531* (2021.01); *G02F 1/13439* (2013.01);
(Continued)

(58) Field of Classification Search
None
See application file for complete search history.

(56) References Cited

U.S. PATENT DOCUMENTS

| 4,423,929 A | 1/1984 | Gomi |
| 11,061,290 B1* | 7/2021 | Tang ................... G02F 1/139 |

(Continued)

FOREIGN PATENT DOCUMENTS

| JP | 2001194626 A | 7/2001 |
| JP | 2009014778 A | 1/2009 |

(Continued)

OTHER PUBLICATIONS

International Preliminary Report on Patentability for International Application No. PCT/US2021/064257, mailed Aug. 10, 2023, 7 pages.

(Continued)

*Primary Examiner* — Ryan Crockett
(74) *Attorney, Agent, or Firm* — Foley & Lardner LLP

(57) ABSTRACT

Various embodiments set forth optical patterning systems. Each pixel of the optical patterning systems includes an amplitude-modulating cell that is in line with a phase-modulating cell. The amplitude-modulating cell includes a liquid crystal and a drive method for modulating at least the amplitude of a wavefront of light that passes through the amplitude-modulating cell. The phase-modulating cell includes a liquid crystal and a drive method for modulating at least the phase of a wavefront of light that passes through the phase-modulating cell. In some embodiments, the amplitude-modulating cell shares a common ground with the phase-modulating cell. The amplitude-modulating cell and the phase-modulating cell can be used to independently control the amplitude change and phase delay imparted by the pixel, enabling complex wavefront modulation.

11 Claims, 11 Drawing Sheets

(51) Int. Cl.
  *G02F 1/1343* (2006.01)
  *G02F 1/139* (2006.01)
  *H10K 59/50* (2023.01)
(52) U.S. Cl.
  CPC ........ *G02F 1/1396* (2013.01); *G02F 2203/02* (2013.01); *H10K 59/50* (2023.02)

(56) References Cited

U.S. PATENT DOCUMENTS

| | | | |
|---|---|---|---|
| 11,209,584 B1 | 12/2021 | Wu et al. | |
| 2001/0043295 A1 | 11/2001 | Chen et al. | |
| 2005/0007517 A1 | 1/2005 | Anandan | |
| 2005/0162606 A1* | 7/2005 | Doane | G02F 1/133305 349/158 |
| 2007/0139299 A1* | 6/2007 | Huang | G02F 1/13452 345/3.1 |
| 2007/0159574 A1* | 7/2007 | Burberry | G02F 1/134309 349/74 |
| 2015/0323817 A1* | 11/2015 | Kim | G03H 1/2294 349/96 |
| 2016/0238906 A1* | 8/2016 | Wu | G02F 1/134336 |
| 2017/0363472 A1* | 12/2017 | Abdulhalim | G01J 3/447 |
| 2020/0233214 A1 | 7/2020 | Jia et al. | |
| 2021/0027677 A1* | 1/2021 | Jiang | H10K 50/86 |

FOREIGN PATENT DOCUMENTS

| | | |
|---|---|---|
| KR | 20210085429 A | 7/2021 |
| KR | 20210085430 A | 7/2021 |
| WO | 2019184090 A1 | 10/2019 |

OTHER PUBLICATIONS

International Search Report and Written Opinion for International Application No. PCT/US2021/064257, mailed Apr. 7, 2022, 8 pages.

* cited by examiner

TECHNIQUES FOR COMPLEX WAVEFRONT MODULATION

CROSS-REFERENCE TO RELATED APPLICATION

This application is a divisional of the co-pending U.S. patent application titled, "TECHNIQUES FOR COMPLEX WAVEFRONT MODULATION," filed on Jan. 29, 2021, and having Ser. No. 17/162,060. The subject matter of this related application is hereby incorporated herein by reference.

BACKGROUND

Field of the Various Embodiments

Embodiments of this disclosure relate generally to optical systems and, more specifically, to techniques for complex wavefront modulation.

Description of the Related Art

Holography uses light interference patterns to form three-dimensional (3D) images. A traditional hologram is a holographic interference pattern of light from a real object and light from a coherent light source. Computer-generated holography applies various algorithms to simulate the holographic interference patterns of traditional holograms. A computer-generated hologram can be presented by using a spatial light modulator (SLM) to encode light from a light source with the pattern output by such an algorithm.

SLMs impose spatially varying modulation on light beams. Conventional SLMs modulate either the amplitude or phase of the wavefront of a light beam. Oftentimes, computer-generated holography requires both amplitude and phase modulation of a wavefront, which is also referred to as complex wavefront modulation. One approach for complex wavefront modulation uses filters to combine pairs of pixels in a phase-only SLM into "super pixels" that enable both amplitude and phase modulation. However, the filters can attenuate light passing through them, reducing the optical efficiency of the SLM, and introduce additional noise. In addition, holograms generated using super pixels are oftentimes low in quality.

As the foregoing illustrates, what is needed in the art are more effective techniques for complex wavefront modulation.

SUMMARY

One embodiment of the present disclosure sets forth an optical patterning system including a plurality of pixels. Each of the pixels includes a first liquid crystal cell that modulates at least an amplitude of light, and a second liquid crystal cell that modulates at least a phase of the light. The first liquid crystal cell is in line with the second liquid crystal cell.

Another embodiment of the present disclosure sets forth a cell that includes a first liquid crystal cell that modulates at least an amplitude of light. The cell also includes a second liquid crystal cell that is in line with the first liquid crystal cell and modulates at least a phase of the light.

Another embodiment of the present disclosure sets forth a method for modulating light. The method includes determining states of a plurality of pixels for at least one point in time. The method further includes driving each pixel included in the plurality of pixels based on a corresponding state. Driving the pixel includes driving a first liquid crystal cell to modulate at least an amplitude of light, and driving a second liquid crystal cell to modulate at least a phase of the light. The first liquid crystal cell is in line with the second liquid crystal cell. In addition, the method includes projecting a light beam that is incident on the plurality of pixels.

One advantage of the techniques disclosed herein is greater optical efficiency and lower noise relative to complex wavefront modulation systems that combine pairs of pixels into super pixels using filters. In addition, the techniques disclosed herein can be used to generate relatively high quality holograms. These technical advantages represent one or more technological advancements over prior art approaches.

BRIEF DESCRIPTION OF THE DRAWINGS

So that the manner in which the above recited features of the various embodiments can be understood in detail, a more particular description of the disclosed concepts, briefly summarized above, may be had by reference to various embodiments, some of which are illustrated in the appended drawings. It is to be noted, however, that the appended drawings illustrate only typical embodiments of the disclosed concepts and are therefore not to be considered limiting of scope in any way, and that there are other equally effective embodiments.

DETAILED DESCRIPTION

Figure 1A:
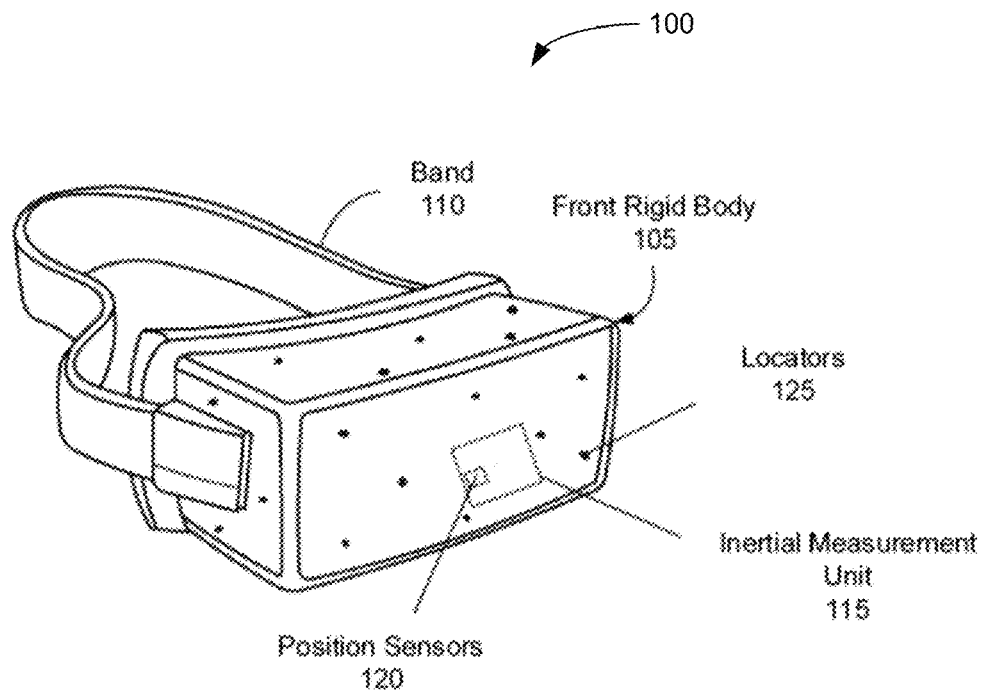
FIG. 1A is a diagram of a near eye display (NED), according to various embodiments.

In the following description, numerous specific details are set forth to provide a more thorough understanding of the various embodiments. However, it is apparent to one of skilled in the art that the disclosed concepts may be practiced without one or more of these specific details.

Configuration Overview

One or more embodiments disclosed herein relate to optical patterning systems. In some embodiments, each pixel of an optical patterning system includes an amplitude-modulating cell that is in line with a phase-modulating cell. The amplitude-modulating cell includes a liquid crystal and a drive method for modulating at least the amplitude of a wavefront of light that passes through the amplitude-modulating cell. The phase-modulating cell includes a liquid crystal and a drive method for modulating at least the phase of a wavefront of light that passes through the phase-modulating cell. In some embodiments, the amplitude-modulating cell and the phase-modulating cell share a common ground that substantially eliminates interference between electric fields generated in the two cells, allowing the two cells to be driven independently. Further, the amplitude-modulating cell and the phase-modulating cell can be used to independently control the amplitude change and phase delay imparted by the pixel, enabling complex wavefront modulation. The optical patterning systems disclosed herein may reflective, transmissive, or transflective. Further, the optical patterning systems may be used as spatial light modulators and in holography (e.g., polarization volume holograms, point source holograms, Fourier transform holograms, or other computer-generated holograms), among other things.

Embodiments of the disclosure may also include or be implemented in conjunction with an artificial reality system. Artificial reality is a form of reality that has been adjusted in some manner before presentation to a user, which may include, for example, a virtual reality (VR) system, an augmented reality (AR) system, a mixed reality (MR) system, a hybrid reality system, or some combination and/or derivatives thereof. Artificial reality content may include, without limitation, completely generated content or generated content combined with captured (e.g., real-world) content. The artificial reality content may include, without limitation, video, audio, haptic feedback, or some combination thereof. The artificial reality content may be presented in a single channel or in multiple channels (such as stereo video that produces a three-dimensional effect to the viewer). Additionally, in some embodiments, artificial reality systems may also be associated with applications, products, accessories, services, or some combination thereof, that are used to, e.g., create content in an artificial reality system and/or are otherwise used in (e.g., perform activities in) an artificial reality system. The artificial reality system may be implemented on various platforms, including a head-mounted display (HMD) connected to a host computer system, a standalone HMD, a mobile device or computing system, or any other hardware platform capable of providing artificial reality content to one or more viewers.

System Overview

FIG. 1A is a wire diagram of a near eye display (NED) 100, according to various embodiments. Although NEDs and head mounted displays (HMDs) are disclosed herein as reference examples, display devices that include the optical patterning system disclosed herein also be configured for placement in proximity of an eye or eyes of the user at a fixed location, without being head-mounted (e.g., the display device may be mounted in a vehicle, such as a car or an airplane, for placement in front of an eye or eyes of the user).

As shown, the NED 100 includes a front rigid body 105 and a band 110. The front rigid body 105 includes one or more electronic display elements of an electronic display (not shown), an inertial measurement unit (IMU) 115, one or more position sensors 120, and locators 125. As illustrated in FIG. 1A, position sensors 120 are located within the IMU 115, and neither the IMU 115 nor the position sensors 120 are visible to the user. In various embodiments, where the NED 100 acts as an AR or MR device, portions of the NED 100 and/or its internal components are at least partially transparent.

Figure 1B:
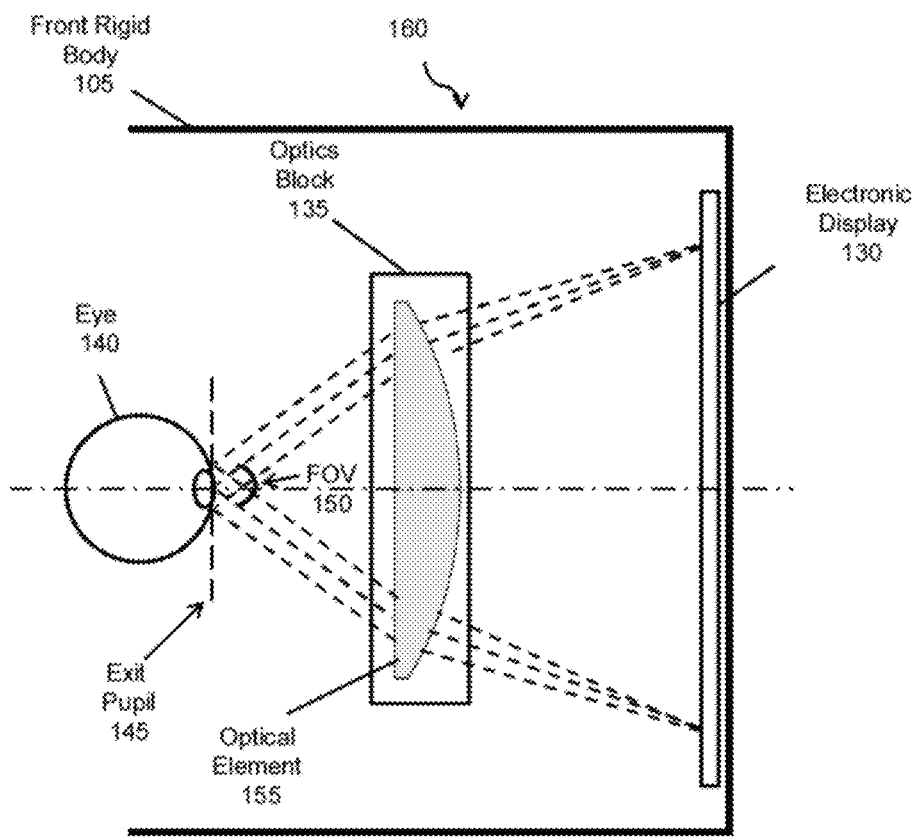
FIG. 1B is a cross section of the front rigid body of the embodiments of the NED illustrated in FIG. 1A.

FIG. 1B is a cross section 160 of the front rigid body 105 of the embodiments of the NED 100 illustrated in FIG. 1A. As shown, the front rigid body 105 includes an electronic display 130 and an optics block 135 that together provide image light to an exit pupil 145. The exit pupil 145 is the location of the front rigid body 105 where a user's eye 140 may be positioned. For purposes of illustration, FIG. 1B illustrates a cross section 160 associated with a single eye 140, but another optics block, separate from the optics block 135, may provide altered image light to another eye of the user. Additionally, the NED 100 includes an eye tracking system (not shown in FIG. 1B). The eye tracking system may include one or more sources that illuminate one or both eyes of the user. The eye tracking system may also include one or more cameras that capture images of one or both eyes of the user to track the positions of the eyes.

The electronic display 130 displays images to the user. In various embodiments, the electronic display 130 may comprise a single electronic display or multiple electronic displays (e.g., a display for each eye of a user). Examples of the electronic display 130 include: a liquid crystal display (LCD), an organic light emitting diode (OLED) display, an active-matrix organic light-emitting diode display (AMOLED), a QOLED, a QLED, some other display, or some combination thereof.

The optics block 135 adjusts an orientation of image light emitted from the electronic display 130 such that the electronic display 130 appears at particular virtual image distances from the user. The optics block 135 is configured to receive image light emitted from the electronic display 130 and direct the image light to an eye-box associated with the exit pupil 145. The image light directed to the eye-box forms an image at a retina of eye 140. The eye-box is a region defining how much the eye 140 moves up/down/left/right from without significant degradation in the image quality. In the illustration of FIG. 1B, a field of view (FOV) 150 is the extent of the observable world that is seen by the eye 140 at any given moment.

Additionally, in some embodiments, the optics block 135 magnifies received light, corrects optical errors associated with the image light, and presents the corrected image light to the eye 140. The optics block 135 may include one or more optical elements 155 in optical series. An optical element 155 may be an aperture, a Fresnel lens, a convex lens, a concave lens, a filter, a waveguide, a PBP lens or grating, a color-selective filter, a waveplate, a C-plate, a spatial light modulator, or any other suitable optical element 155 that affects the image light. Moreover, the optics block 135 may include combinations of different optical elements.

One or more of the optical elements in the optics block 135 may have one or more coatings, such as anti-reflective coatings. In some embodiments, the optics block 135 may include one or more of the optical patterning systems discussed in detail below in conjunction with FIGS. 4-11.

Figure 2A:
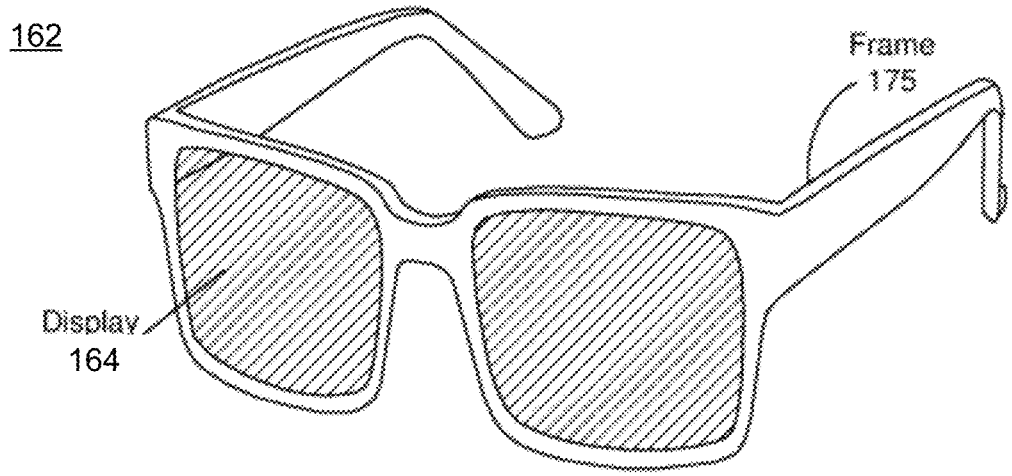
FIG. 2A is a diagram of a head-mounted display (HMD) implemented as a NED, according to various embodiments.

FIG. 2A is a diagram of an HMD 162 implemented as a NED, according to various embodiments. As shown, the HMD 162 is in the form of a pair of augmented reality glasses. The HMD 162 presents computer-generated media to a user and augments views of a physical, real-world environment with the computer-generated media. Examples of computer-generated media presented by the HMD 162 include one or more images, video, audio, or some combination thereof. In some embodiments, audio is presented via an external device (e.g., speakers and headphones) that receives audio information from the HMD 162, a console (not shown), or both, and presents audio data based on audio information. In some embodiments, the HMD 162 may be modified to also operate as a virtual reality (VR) HMD, a mixed reality (MR) HMD, or some combination thereof. The HMD 162 includes a frame 175 and a display 164. As shown, the frame 175 mounts the near eye display to the user's head, while the display 164 provides image light to the user. The display 164 may be customized to a variety of shapes and sizes to conform to different styles of eyeglass frames.

Figure 2B:
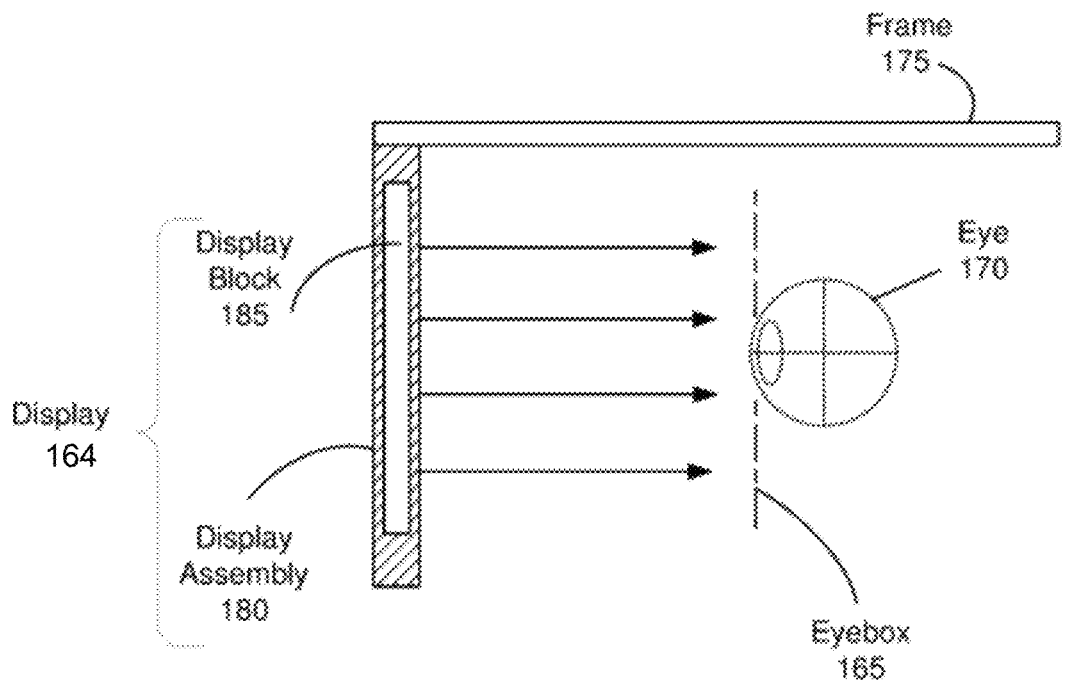
FIG. 2B is a cross-section view of the HMD of FIG. 2A implemented as a near eye display, according to various embodiments.

FIG. 2B is a cross-section view of the HMD 162 of FIG. 2A implemented as a NED, according to various embodiments. This view includes frame 175, display 164 (which comprises a display assembly 180 and a display block 185), and eye 170. The display assembly 180 supplies image light to the eye 170. The display assembly 180 houses display block 185, which, in different embodiments, encloses the different types of imaging optics and redirection structures. For purposes of illustration, FIG. 2B shows the cross section associated with a single display block 185 and a single eye 170, but in alternative embodiments not shown, another display block, which is separate from display block 185 shown in FIG. 2B, provides image light to another eye of the user.

The display block 185, as illustrated, is configured to combine light from a local area with light from a computer generated image to form an augmented scene. The display block 185 is also configured to provide the augmented scene to the eyebox 165 corresponding to a location of the user's eye 170. The display block 185 may include, for example, a waveguide display, a focusing assembly, a compensation assembly, or some combination thereof.

HMD 162 may include one or more other optical elements between the display block 185 and the eye 170. The optical elements may act to, for example, correct aberrations in image light emitted from the display block 185, magnify image light emitted from the display block 185, some other optical adjustment of image light emitted from the display block 185, or some combination thereof. The example for optical elements may include an aperture, a Fresnel lens, a convex lens, a concave lens, a filter, or any other suitable optical element that affects image light. In some embodiments, the optical elements may include one or more of the optical patterning systems discussed in detail below in conjunction with FIGS. 4-11. The display block 185 may also comprise one or more materials (e.g., plastic, glass, etc.) with one or more refractive indices that effectively minimize the weight and widen a field of view of the HMD 162.

Figure 3:
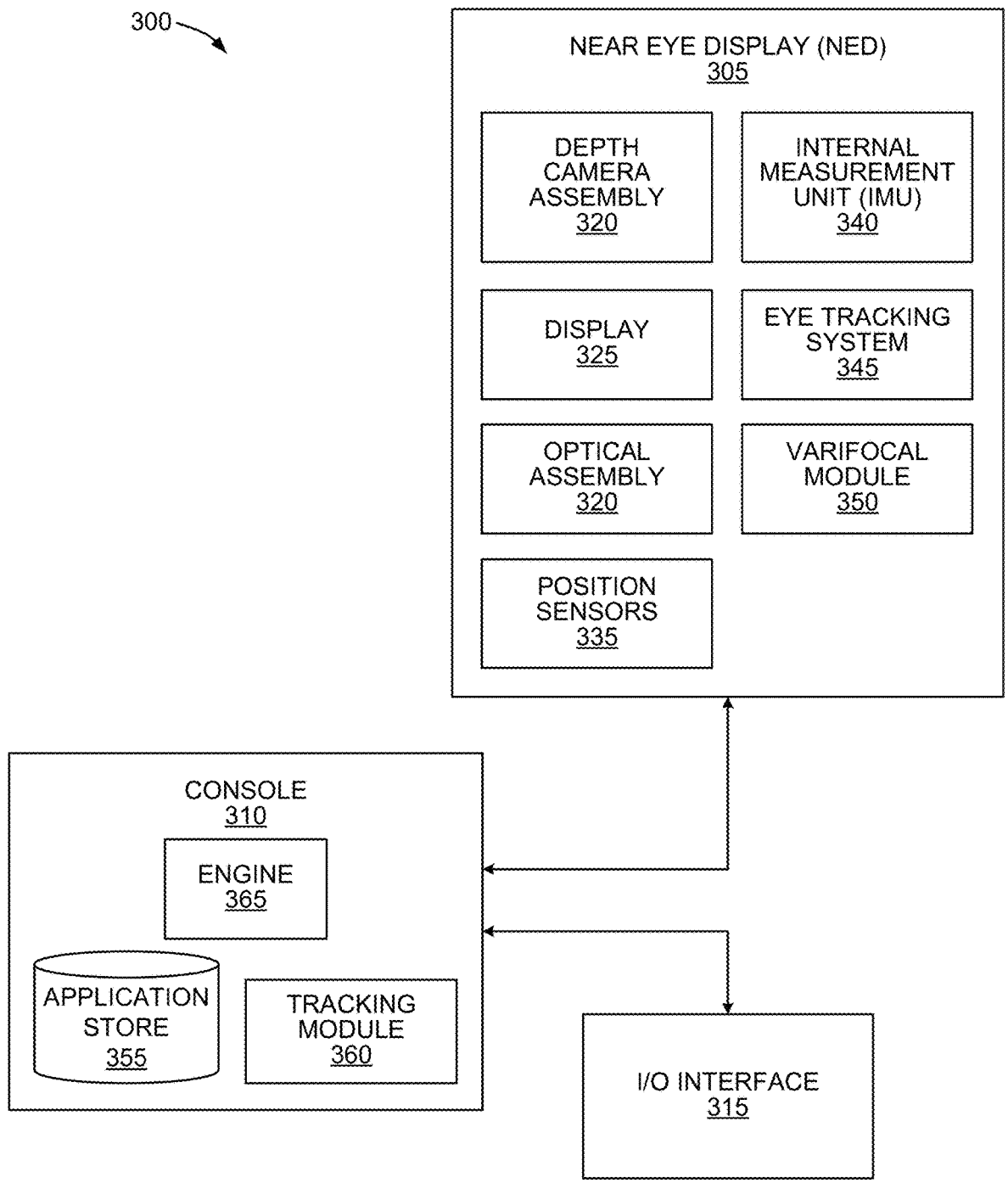
FIG. 3 is a block diagram of a NED system, according to various embodiments.

FIG. 3 is a block diagram of an embodiment of a near eye display system 300 in which a console 310 operates. In some embodiments, the NED system 300 corresponds to the NED 100 or the HMD 162. The NED system 300 may operate in a virtual reality (VR) system environment, an augmented reality (AR) system environment, a mixed reality (MR) system environment, or some combination thereof. The NED system 300 shown in FIG. 3 comprises a NED 305 and an input/output (I/O) interface 315 that is coupled to the console 310.

While FIG. 3 shows an example NED system 300 including one NED 305 and one I/O interface 315, in other embodiments any number of these components may be included in the NED system 300. For example, there may be multiple NEDs 305 that each has an associated I/O interface 315, where each NED 305 and I/O interface 315 communicates with the console 310. In alternative configurations, different and/or additional components may be included in the NED system 300. Additionally, various components included within the NED 305, the console 310, and the I/O interface 315 may be distributed in a different manner than is described in conjunction with FIG. 3 in some embodiments. For example, some or all of the functionality of the console 310 may be provided by the NED 305.

The NED 305 may be a head-mounted display that presents content to a user. The content may include virtual and/or augmented views of a physical, real-world environment including computer-generated elements (e.g., two-dimensional or three-dimensional images, two-dimensional or three-dimensional video, sound, etc.). In some embodiments, the NED 305 may also present audio content to a user. The NED 305 and/or the console 310 may transmit the audio content to an external device via the I/O interface 315. The external device may include various forms of speaker systems and/or headphones. In various embodiments, the audio content is synchronized with visual content being displayed by the NED 305.

The NED 305 may comprise one or more rigid bodies, which may be rigidly or non-rigidly coupled together. A rigid coupling between rigid bodies causes the coupled rigid bodies to act as a single rigid entity. In contrast, a non-rigid coupling between rigid bodies allows the rigid bodies to move relative to each other.

As shown in FIG. 3, the NED 305 may include a depth camera assembly (DCA) 320, a display 325, an optical assembly 330, one or more position sensors 335, an inertial measurement unit (IMU) 340, an eye tracking system 345, and a varifocal module 350. In some embodiments, the display 325 and the optical assembly 330 can be integrated together into a projection assembly. Various embodiments of the NED 305 may have additional, fewer, or different components than those listed above. Additionally, the functionality of each component may be partially or completely encompassed by the functionality of one or more other components in various embodiments.

The DCA 320 captures sensor data describing depth information of an area surrounding the NED 305. The sensor data may be generated by one or a combination of depth imaging techniques, such as triangulation, structured light imaging, time-of-flight imaging, laser scan, and so forth. The DCA 320 can compute various depth properties of the area surrounding the NED 305 using the sensor data. Additionally or alternatively, the DCA 320 may transmit the sensor data to the console 310 for processing.

The DCA 320 includes an illumination source, an imaging device, and a controller. The illumination source emits light onto an area surrounding the NED 305. In an embodiment, the emitted light is structured light. The illumination source includes a plurality of emitters that each emits light having certain characteristics (e.g., wavelength, polarization, coherence, temporal behavior, etc.). The characteristics may be the same or different between emitters, and the emitters can be operated simultaneously or individually. In one embodiment, the plurality of emitters could be, e.g., laser diodes (such as edge emitters), inorganic or organic light-emitting diodes (LEDs), a vertical-cavity surface-emitting laser (VCSEL), or some other source. In some embodiments, a single emitter or a plurality of emitters in the illumination source can emit light having a structured light pattern. The imaging device captures ambient light in the environment surrounding NED 305, in addition to light reflected off of objects in the environment that is generated by the plurality of emitters. In various embodiments, the imaging device may be an infrared camera or a camera configured to operate in a visible spectrum. The controller coordinates how the illumination source emits light and how the imaging device captures light. For example, the controller may determine a brightness of the emitted light. In some embodiments, the controller also analyzes detected light to detect objects in the environment and position information related to those objects.

The display 325 displays two-dimensional or three-dimensional images to the user in accordance with pixel data received from the console 310. In various embodiments, the display 325 comprises a single display or multiple displays (e.g., separate displays for each eye of a user). In some embodiments, the display 325 comprises a single or multiple waveguide displays. Light can be coupled into the single or multiple waveguide displays via, e.g., a liquid crystal display (LCD), an organic light emitting diode (OLED) display, an inorganic light emitting diode (ILED) display, an active-matrix organic light-emitting diode (AMOLED) display, a transparent organic light emitting diode (TOLED) display, a laser-based display, one or more waveguides, other types of displays, a scanner, a one-dimensional array, and so forth. In addition, combinations of the displays types may be incorporated in display 325 and used separately, in parallel, and/or in combination.

The optical assembly 330 magnifies image light received from the display 325, corrects optical errors associated with the image light, and presents the corrected image light to a user of the NED 305. The optical assembly 330 includes a plurality of optical elements. For example, one or more of the following optical elements may be included in the optical assembly 330: an aperture, a Fresnel lens, a convex lens, a concave lens, a filter, a reflecting surface, or any other suitable optical element that deflects, reflects, refracts, and/or in some way alters image light. Moreover, the optical assembly 330 may include combinations of different optical elements. In some embodiments, one or more of the optical elements in the optical assembly 330 may have one or more coatings, such as partially reflective or antireflective coatings. The optical assembly 330 can be integrated into a projection assembly, e.g., a projection assembly. In one embodiment, the optical assembly 330 includes the optics block 155.

In operation, the optical assembly 330 magnifies and focuses image light generated by the display 325. In so doing, the optical assembly 330 enables the display 325 to be physically smaller, weigh less, and consume less power than displays that do not use the optical assembly 330. Additionally, magnification may increase the field of view of the content presented by the display 325. For example, in some embodiments, the field of view of the displayed content partially or completely uses a user's field of view. For example, the field of view of a displayed image may meet or exceed 310 degrees. In various embodiments, the amount of magnification may be adjusted by adding or removing optical elements.

In some embodiments, the optical assembly 330 may be designed to correct one or more types of optical errors. Examples of optical errors include barrel or pincushion distortions, longitudinal chromatic aberrations, or transverse chromatic aberrations. Other types of optical errors may further include spherical aberrations, chromatic aberrations or errors due to the lens field curvature, astigmatisms, in addition to other types of optical errors. In some embodiments, visual content transmitted to the display 325 is pre-distorted, and the optical assembly 330 corrects the distortion as image light from the display 325 passes through various optical elements of the optical assembly 330. In some embodiments, optical elements of the optical assembly 330 are integrated into the display 325 as a projection assembly that includes at least one waveguide coupled with one or more optical elements.

The IMU 340 is an electronic device that generates data indicating a position of the NED 305 based on measurement signals received from one or more of the position sensors 335 and from depth information received from the DCA 320. In some embodiments of the NED 305, the IMU 340 may be a dedicated hardware component. In other embodiments, the IMU 340 may be a software component implemented in one or more processors.

In operation, a position sensor 335 generates one or more measurement signals in response to a motion of the NED 305. Examples of position sensors 335 include: one or more accelerometers, one or more gyroscopes, one or more magnetometers, one or more altimeters, one or more inclinometers, and/or various types of sensors for motion detection, drift detection, and/or error detection. The position sensors 335 may be located external to the IMU 340, internal to the IMU 340, or some combination thereof.

Based on the one or more measurement signals from one or more position sensors 335, the IMU 340 generates data indicating an estimated current position of the NED 305 relative to an initial position of the NED 305. For example, the position sensors 335 may include multiple accelerometers to measure translational motion (forward/back, up/down, left/right) and multiple gyroscopes to measure rotational motion (e.g., pitch, yaw, and roll). In some embodiments, the IMU 340 rapidly samples the measurement signals and calculates the estimated current position of the NED 305 from the sampled data. For example, the IMU 340 may integrate the measurement signals received from the accelerometers over time to estimate a velocity vector and integrates the velocity vector over time to determine an estimated current position of a reference point on the NED 305. Alternatively, the IMU 340 provides the sampled measurement signals to the console 310, which analyzes the sample data to determine one or more measurement errors. The console 310 may further transmit one or more of control signals and/or measurement errors to the IMU 340 to configure the IMU 340 to correct and/or reduce one or more measurement errors (e.g., drift errors). The reference point is a point that may be used to describe the position of the NED 305. The reference point may generally be defined as a point in space or a position related to a position and/or orientation of the NED 305.

In various embodiments, the IMU 340 receives one or more parameters from the console 310. The one or more parameters are used to maintain tracking of the NED 305. Based on a received parameter, the IMU 340 may adjust one or more IMU parameters (e.g., a sample rate). In some embodiments, certain parameters cause the IMU 340 to update an initial position of the reference point so that it corresponds to a next position of the reference point. Updating the initial position of the reference point as the next calibrated position of the reference point helps reduce drift errors in detecting a current position estimate of the IMU 340.

In some embodiments, the eye tracking system 345 is integrated into the NED 305. The eye-tracking system 345 may comprise one or more illumination sources and an imaging device (camera). In operation, the eye tracking system 345 generates and analyzes tracking data related to a user's eyes as the user wears the NED 305. The eye tracking system 345 may further generate eye tracking information that may comprise information about a position of the user's eye, i.e., information about an angle of an eye-gaze.

In some embodiments, the varifocal module 350 is further integrated into the NED 305. The varifocal module 350 may be communicatively coupled to the eye tracking system 345 in order to enable the varifocal module 350 to receive eye tracking information from the eye tracking system 345. The varifocal module 350 may further modify the focus of image light emitted from the display 325 based on the eye tracking information received from the eye tracking system 345. Accordingly, the varifocal module 350 can reduce vergence-accommodation conflict that may be produced as the user's eyes resolve the image light. In various embodiments, the varifocal module 350 can be interfaced (e.g., either mechanically or electrically) with at least one optical element of the optical assembly 330.

In operation, the varifocal module 350 may adjust the position and/or orientation of one or more optical elements in the optical assembly 330 in order to adjust the focus of image light propagating through the optical assembly 330. In various embodiments, the varifocal module 350 may use eye tracking information obtained from the eye tracking system 345 to determine how to adjust one or more optical elements in the optical assembly 330. In some embodiments, the varifocal module 350 may perform foveated rendering of the image light based on the eye tracking information obtained from the eye tracking system 345 in order to adjust the resolution of the image light emitted by the display 325. In this case, the varifocal module 350 configures the display 325 to display a high pixel density in a foveal region of the user's eye-gaze and a low pixel density in other regions of the user's eye-gaze.

The I/O interface 315 facilitates the transfer of action requests from a user to the console 310. In addition, the I/O interface 315 facilitates the transfer of device feedback from the console 310 to the user. An action request is a request to perform a particular action. For example, an action request may be an instruction to start or end capture of image or video data or an instruction to perform a particular action within an application, such as pausing video playback, increasing or decreasing the volume of audio playback, and so forth. In various embodiments, the I/O interface 315 may include one or more input devices. Example input devices include: a keyboard, a mouse, a game controller, a joystick, and/or any other suitable device for receiving action requests and communicating the action requests to the console 310. In some embodiments, the I/O interface 315 includes an IMU 340 that captures calibration data indicating an estimated current position of the I/O interface 315 relative to an initial position of the I/O interface 315.

In operation, the I/O interface 315 receives action requests from the user and transmits those action requests to the console 310. Responsive to receiving the action request, the console 310 performs a corresponding action. For example, responsive to receiving an action request, the console 310 may configure the I/O interface 315 to emit haptic feedback onto an arm of the user. For example, the console 315 may configure the I/O interface 315 to deliver haptic feedback to a user when an action request is received. Additionally or alternatively, the console 310 may configure the I/O interface 315 to generate haptic feedback when the console 310 performs an action, responsive to receiving an action request.

The console 310 provides content to the NED 305 for processing in accordance with information received from one or more of: the DCA 320, the NED 305, and the I/O interface 315. As shown in FIG. 3, the console 310 includes an application store 355, a tracking module 360, and an engine 365. In some embodiments, the console 310 may have additional, fewer, or different modules and/or components than those described in conjunction with FIG. 3. Similarly, the functions further described below may be distributed among components of the console 310 in a different manner than described in conjunction with FIG. 3.

The application store 355 stores one or more applications for execution by the console 310. An application is a group of instructions that, when executed by a processor, performs a particular set of functions, such as generating content for presentation to the user. For example, an application may generate content in response to receiving inputs from a user (e.g., via movement of the NED 305 as the user moves his/her head, via the I/O interface 315, etc.). Examples of applications include: gaming applications, conferencing applications, video playback applications, or other suitable applications.

The tracking module 360 calibrates the NED system 300 using one or more calibration parameters. The tracking module 360 may further adjust one or more calibration parameters to reduce error in determining a position and/or orientation of the NED 305 or the I/O interface 315. For example, the tracking module 360 may transmit a calibration parameter to the DCA 320 in order to adjust the focus of the DCA 320. Accordingly, the DCA 320 may more accurately determine positions of structured light elements reflecting off of objects in the environment. The tracking module 360 may also analyze sensor data generated by the IMU 340 in determining various calibration parameters to modify. Further, in some embodiments, if the NED 305 loses tracking of the user's eye, then the tracking module 360 may re-calibrate some or all of the components in the NED system 300. For example, if the DCA 320 loses line of sight of at least a threshold number of structured light elements projected onto the user's eye, the tracking module 360 may transmit calibration parameters to the varifocal module 350 in order to re-establish eye tracking.

The tracking module 360 tracks the movements of the NED 305 and/or of the I/O interface 315 using information from the DCA 320, the one or more position sensors 335, the IMU 340 or some combination thereof. For example, the tracking module 360 may determine a reference position of the NED 305 from a mapping of an area local to the NED 305. The tracking module 360 may generate this mapping based on information received from the NED 305 itself. The tracking module 360 may also utilize sensor data from the IMU 340 and/or depth data from the DCA 320 to determine references positions for the NED 305 and/or I/O interface 315. In various embodiments, the tracking module 360 generates an estimation and/or prediction for a subsequent position of the NED 305 and/or the I/O interface 315. The tracking module 360 may transmit the predicted subsequent position to the engine 365.

The engine 365 generates a three-dimensional mapping of the area surrounding the NED 305 (i.e., the "local area") based on information received from the NED 305. In some embodiments, the engine 365 determines depth information for the three-dimensional mapping of the local area based on depth data received from the DCA 320 (e.g., depth information of objects in the local area). In some embodiments, the engine 365 calculates a depth and/or position of the NED 305 by using depth data generated by the DCA 320. In particular, the engine 365 may implement various techniques for calculating the depth and/or position of the NED 305, such as stereo based techniques, structured light illumination techniques, time-of-flight techniques, and so forth. In various embodiments, the engine 365 uses depth data received from the DCA 320 to update a model of the local area and to generate and/or modify media content based in part on the updated model.

The engine 365 also executes applications within the NED system 300 and receives position information, acceleration information, velocity information, predicted future positions, or some combination thereof, of the NED 305 from the tracking module 360. Based on the received information, the engine 365 determines various forms of media content to transmit to the NED 305 for presentation to the user. For example, if the received information indicates that the user has looked to the left, the engine 365 generates media content for the NED 305 that mirrors the user's movement in a virtual environment or in an environment augmenting the local area with additional media content. Accordingly, the engine 365 may generate and/or modify media content (e.g., visual and/or audio content) for presentation to the user. The engine 365 may further transmit the media content to the NED 305. Additionally, in response to receiving an action request from the I/O interface 315, the engine 365 may perform an action within an application executing on the console 310. The engine 305 may further provide feedback when the action is performed. For example, the engine 365 may configure the NED 305 to generate visual and/or audio feedback and/or the I/O interface 315 to generate haptic feedback to the user.

In some embodiments, based on the eye tracking information (e.g., orientation of the user's eye) received from the eye tracking system 345, the engine 365 determines a resolution of the media content provided to the NED 305 for presentation to the user on the display 325. The engine 365 may adjust a resolution of the visual content provided to the NED 305 by configuring the display 325 to perform foveated rendering of the visual content, based at least in part on a direction of the user's gaze received from the eye tracking system 345. The engine 365 provides the content to the NED 305 having a high resolution on the display 325 in a foveal region of the user's gaze and a low resolution in other regions, thereby reducing the power consumption of the NED 305. In addition, using foveated rendering reduces a number of computing cycles used in rendering visual content without compromising the quality of the user's visual experience. In some embodiments, the engine 365 can further use the eye tracking information to adjust a focus of the image light emitted from the display 325 in order to reduce vergence-accommodation conflicts.

Complex Wavefront Modulation Techniques

Figure 4:
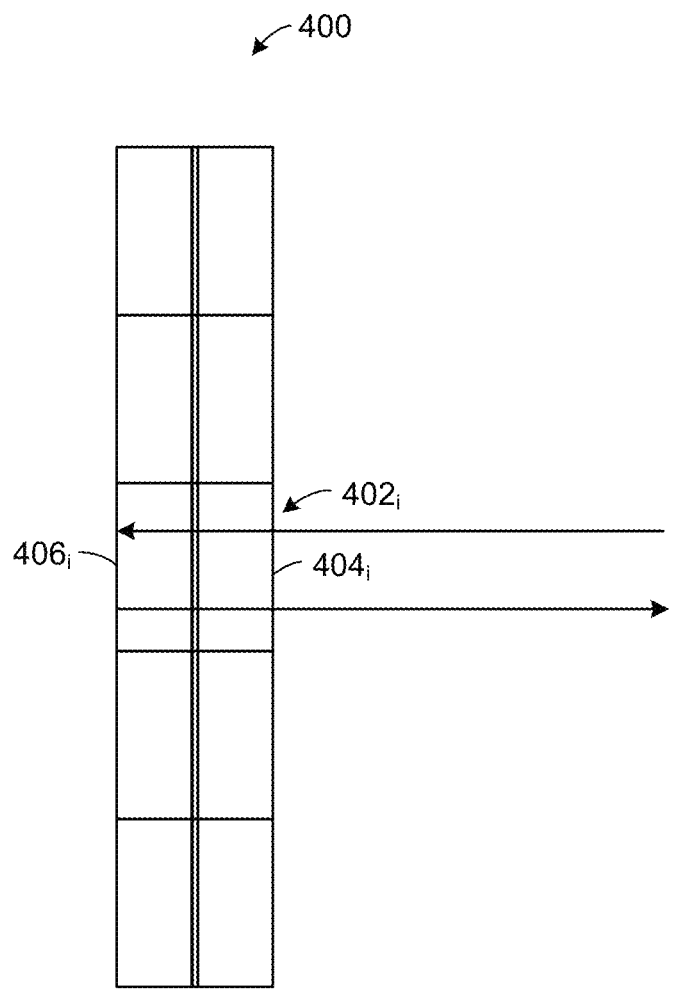
FIG. 4 is a schematic diagram illustrating a cross-section view of an optical patterning system, according to various embodiments.

FIG. 4 is a schematic diagram illustrating a cross-section view of an optical patterning system 400, according to various embodiments. As shown, the optical patterning system 400 includes an array of pixels $402_i$ (collectively referred to as pixels 402 and individually referred to as pixel 402) that are formed by LC cells. Any suitable number of pixels may be included in the optical patterning system 400. In some embodiments, dividers are not required between pixels or cells, although dividers may be used in other embodiments.

Each of the pixels 402 includes a respective amplitude-modulating cell $404_i$ (collectively referred to as amplitude-modulating cells 404 and individually referred to as amplitude-modulating cell 404) that is in line with a phase-modulating cell $406_i$ (collectively referred to as phase-modulating cells 406 and individually referred to as phase-modulating cell 406). Each amplitude-modulating cell 404 includes a liquid crystal (LC) and a drive method (e.g., electrodes), among other things, for modulating the amplitude of a wavefront of light that is incident on the amplitude-modulating cell 404. Although described herein primarily with respect to LCs, birefringent materials other than LCs may be used in other embodiments. In some embodiments, the amplitude-modulating cell 404 also modulates the phase of the wavefront when the amplitude is modulated. The amplitude-modulating cell 404 can include any technically feasible elements that modulate the amplitude of a wavefront of light, or the amplitude and phase of a wavefront of light. The elements of an exemplar amplitude-modulating cell are described below in conjunction with FIGS. 5A-5B.

Illustratively, the amplitude-modulating cells 404 are transmissive, allowing light incident thereon to pass through to corresponding phase-modulating cells 406 that are reflective. In other embodiments, the relative positions of the amplitude-modulating cells and the phase-modulating cells may be switched from the positions shown in FIG. 4. In such cases, the amplitude-modulating cells may be reflective, and the phase-modulating cells may be transmissive. In yet further embodiments, the phase-modulating cells (or the amplitude-modulating cells if positions of the amplitude- and phase-modulating cells are switched) may be transflective, i.e., partially reflective and partially transmissive.

Each of the phase-modulating cells 406 includes a LC and a drive method, among other things, for modulating the phase of a wavefront of light that has passed through a corresponding amplitude-modulating cell 404. In some embodiments, the phase-modulating cells 406 can include any technically feasible elements that modulate the phase of a wavefront of light. The elements of an exemplar phase-modulating cell are described below in conjunction with FIGS. 5A-5B. Illustratively, the phase-modulating cells 406 are reflective. In operation, light that has passed through one of the amplitude-modulating cell 404 is reflected back by a corresponding phase-modulating cell 406. The reflected light then passes through the amplitude-modulating cell 404 again. Accordingly, the amplitude-modulating cell 404 can attenuate the amplitude of light twice.

Together, the amplitude-modulating cells 404 form an amplitude optical patterning system that can be used to modulate the amplitude of a wavefront of light with a spatially varying amplitude modulation. The amplitude-modulating cells 404 may also produce unintended phase modulation in some embodiments. Together, the phase-modulating cells 406 form a phase-only optical patterning system that can be used to modulate the phase of a wavefront of light with a spatially varying phase modulation. In some embodiments, the phase-modulating cells 406 permit phase modulation between 0 and approximately 360 degrees (2 pi in radians), or a multiple thereof. In such cases, any unintended phase modulation by the amplitude-modulating cells 404 can be compensated for using the phase-modulating cells 406. For example, a lookup table could be created to indicate the total phase modulation when a phase-modulating cell 406 and a corresponding amplitude-modulating cell 404 are driven with various voltages. Thereafter, the driving voltages required to produce a desired phase modulation could be determined using the lookup table. In yet further embodiments, each of the amplitude-modulating cells 404 and the phase-modulating cells 406 may modulate both the amplitude and phase of the wavefront of light. For example, the phase-modulating cells 406 could affect the intensity of a wavefront of light, which can be compensated for using corresponding amplitude-modulating cells 404. In such cases, a lookup table could be created to indicate the total amplitude and phase modulation when an amplitude-modulating cell 404 and a corresponding phase-modulating cell 406 are driven with various voltages. Thereafter, the driving voltages required to produce a desired amplitude and phase modulation could be determined using the lookup table.

In some embodiments, the amplitude-modulating cells 404 are driven with voltages that are square roots of desired (i.e., target) levels of brightness. Such a square root modulation produces a linear modulation in the amplitude of light that passes through the amplitude-modulating cells 404 twice. In a voltage-brightness gamma curve, the brightness modulation at the amplitude-modulating cells 404 is a square root of the desired level of brightness modulation of the optical patterning system 400. Further, in some embodiments, amplitude and phase modulation can be controlled independently via the amplitude-modulating cells 404 and the phase-modulating cells 406, respectively, or via a combination of the amplitude-modulating cells 604 and the phase-modulating cells 606.

For example, the optical patterning system 400 could be used to modulate the amplitude and phase of a light beam emitted by a coherent light source to generate holograms (e.g., polarization volume holograms, point source holograms, Fourier transform holograms, or other computer-generated holograms). Examples of coherent light sources include lasers and certain light emitting diodes (LEDs), superluminescent LEDs (sLEDs), microLEDs (mLED)s, or some combination thereof. As other examples, the optical patterning system 400 could be used in video or image projection, optical correlation, wavelength selective switching, diffractive optical components, or any other suitable applications.

Figure 5A:
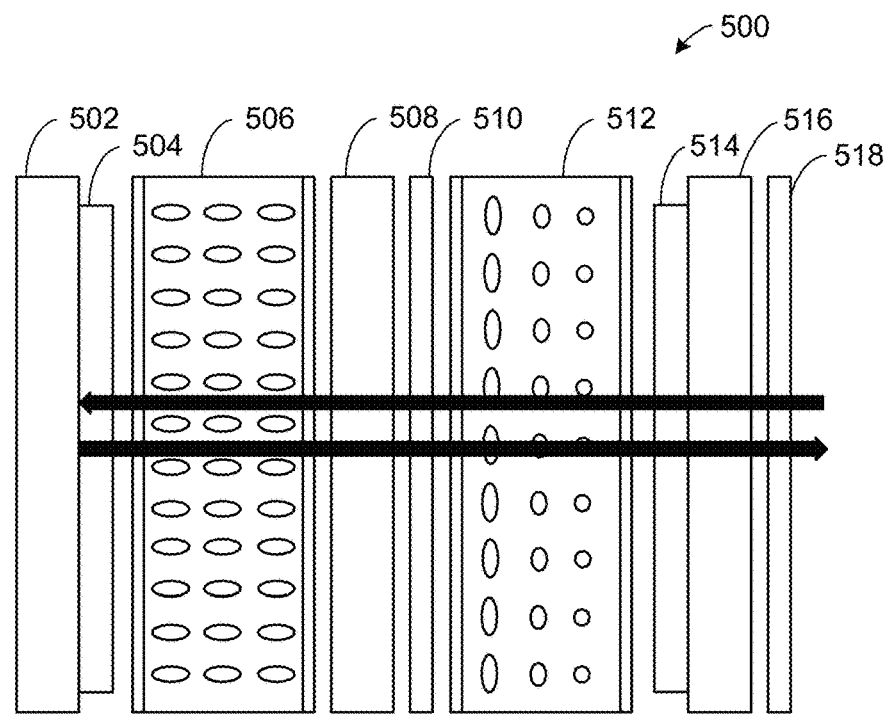
FIG. 5A is a schematic diagram illustrating a cross-section view of an exemplar pixel in one state, according to various embodiments.

FIG. 5A is a schematic diagram illustrating a cross-section view of an exemplar pixel 500 of the optical patterning system 400 in one state, according to various embodiments. All or some of the components of the pixel 500 may be in physical contact with one another, share a substrate with one another, laminated with one another, optically in contact with one another, have index matching fluid or optical glue between one another, and/or may have space therebetween.

As shown, the pixel 500 includes a reflective substrate 502, a transparent electrode 504, a LC 506, and a transparent ground 508. Together, the reflective substrate 502, the transparent electrode 504, and the transparent ground 508 form a phase-modulating cell, corresponding to one of the phase-modulating cells 406 described above in conjunction with FIG. 4. The reflective substrate 502, the transparent electrode 504, and the transparent ground 508 may be constructed from any technically feasible materials and have any suitable thickness. In some embodiments, the pixel 500 may be a silicon (LCOS) pixel. In such cases, the reflective substrate 502 may be a silicon backplane on which circuitry, including the transparent electrode 504, and other elements, including the LC 506 and the transparent ground 508, are layered. Some embodiments may also include a reflective layer (not shown), such as an aluminum layer, on top of the silicon backplane. Although shown as a reflective substrate, in some embodiments, the substrate 502 may be transflective, i.e., partially reflective and partially transmissive. In some embodiments, the transparent electrode 504 includes a thin-film transistor (TFT). In some embodiments, the transparent ground 508 includes an Indium Tin Oxide (ITO) layer.

Liquid crystals are birefringent, meaning the refractive index of a LC depends on the orientation of molecules in the material. As shown, the LC 506 is a vertically-aligned (VA) LC. In some embodiments, the VA LC is a uniaxial nematic LC having an ordinary refractive index along an optical axis, sometimes referred to as the "director," with which anisotropic molecules of the LC 506 are ordinarily aligned, as well as an extraordinary refractive index along a direction perpendicular to the optical axis. In such cases, a voltage may be applied to via the transparent electrode 504 to generate an electric field that reorients molecules in the LC 506, thereby changing the refractive index with respect to light passing through the LC 506. Changing the refractive index can introduce a phase delay to the light passing through the LC 506, allowing phase modulation of such light by controlling the voltage applied via the transparent electrode 504. Although described herein primarily with respect to reorienting the molecules of LCs with electric fields, magnetic fields may be used in lieu of electric fields in other embodiments.

In some embodiments, the LC 506 includes alignment layers that induce molecules of the LC 506 into a substantially uniform vertical alignment. For example, the alignment layers could be formed by rubbing polymer surfaces. More generally, any technically feasible process may be used to align the molecules of the LC 506. Although a VA LC is shown for illustrative purposes, other embodiments may include LCs with any suitable properties that permit phase modulation, such as a variation of the vertically aligned LC, a parallel aligned (PA) LC in which molecules are aligned parallel to alignment layers of the LC, a twisted nematic LC, etc.

As shown, the pixel 500 also includes a linear polarizer 510, a LC 512, a transparent electrode 514, a transparent substrate 516, and another linear polarizer 518. Together, the transparent ground 508, the linear polarizers 510 and 518, the LC 512, the transparent electrode 514, and the transparent substrate 516 form an amplitude-modulating cell, corresponding to one of the amplitude-modulating cells 404 described above in conjunction with FIG. 4.

As shown, the amplitude-modulating cell shares the transparent ground 508 with the phase-modulating cell, described above. In some embodiments, the transparent electrode 504 and the transparent electrode 514 can be independently driven to produce electric fields between the transparent electrodes 504 and 514 and the transparent ground 508 that reorient molecules in the LC 506 and the Lc 512, respectively. In such cases, the generated electric fields are separated by the transparent ground 508. Accordingly, cross-talk is substantially eliminated, i.e., the electric fields do not substantially interfere with each other. In other embodiments, the amplitude-modulating cell and the phase-modulating cell may include separate transparent grounds.

The linear polarizer 510, the LC 512, the transparent electrode 514, the transparent substrate 516, and the linear polarizer 518 may be constructed from any technically feasible materials have any suitable thickness. In some embodiments, the transparent electrode 514 includes a TFT. In some embodiments, the transparent substrate 516 includes glass or another transparent material.

In some embodiments, the linear polarizers 510 and 518 are cross-polarized, i.e., the linear polarizers 510 and 518 polarize light in orthogonal directions. For example, the linear polarizer 510 could be a p polarizer, and the linear polarizer 518 could be an s polarizer, or vice versa. Although described herein primarily with respect to cross-polarized linear polarizers, in other embodiments, the linear polarizers may not be cross-polarized. For example, in some embodiments, linear polarizers having the same polarizations may be used. In such cases, rather than being ordinarily transparent when no electric field is applied in the amplitude-modulating cells, the pixel 500 may ordinarily be opaque. In some other embodiments, circular polarizers may be used instead of linear polarizers. For example, circularly polarized light could be converted to linearly polarized light after passing through the amplitude-modulating cells, and linearly polarized light that is reflected and passes through the phase-modulating cells could be converted back into circularly polarized light before being passed through the amplitude-modulating cells again.

In some embodiments, the LC 512 is a twisted nematic (TN) LC. In such cases, molecules of the TN LC are ordinarily oriented so as to rotate the linear polarization of light passing through the TN LC by approximately 90 degrees (pi/2 radians). For example, if the linear polarizer 518 is an s polarizer, then the LC 512 could rotate s polarized light that is output by the linear polarizer 518 by 90 degrees to become p polarized light. In some embodiments, the LC 512 includes alignment layers that twist molecules in the TN LC so as to achieve 90 degree rotation of the polarization of light in the absence of an electric field. Although a TN LC is shown for illustrative purposes, other embodiments may include LCs with any suitable properties that permit amplitude modulation, such as a variation of the TN LC (e.g., a super-twisted nematic LC), a PA LC such as those used in in-plane switching devices, a VA LC, etc. Although described herein primarily with respect to rotating the linear polarization of light, the LC 512 may output elliptically polarized light in some embodiments. Returning to the example of a TN LC, the TN LC could produce some noise, such that s polarized light that is incident on the TN LC is converted to elliptically polarized light that is primarily p polarized but also includes an s polarized component. In such a case, the linear polarizer 510 could permit the p polarized component of light to pass through and block the s polarized component.

In operation, a voltage can be applied via the electrode 514 to generate an electric field that reorients molecules in the LC 512, thereby changing the refractive index with respect to light passing through the LC 512. Changing the refractive index changes the degree to which the linear polarization of light passing through the LC 512 is rotated. In some embodiments, rather than rotating the linear polarization of light passing through the LC 512 by approximately 90 degrees, an electric field may be applied to reorient molecules in the LC 512 such that the polarization of light is rotated by less than 90 degrees (or some angle angle). For example, depending on the strength of the electric field that is applied, s polarized light passing through the LC 512 could be rotated by less than 90 degrees.

The linear polarizer 510 acts as an analyzer that permits light to pass through to varying degrees, or blocks such light, depending on the linear polarization of the light. In some embodiments in which the linear polarizer 510 is cross-polarized with respect to the linear polarizer 518 and the LC 512 is a TN LC that rotates the linear polarization of light by approximately 90 degrees absent an electric field, the linear polarizer 510 permits such light whose linear polarization is rotated by 90 degrees to pass through. In addition, the linear polarizer 510 blocks light whose linear polarization is not rotated, or partially blocks light whose polarization is rotated by less than 90 degrees, when an electric field is applied via the electrode 514 that reorients molecules in the LC 512. For light that is reflected back by the reflective substrate 502, the linear polarizer 510 acts as an initial polarizer and the linear polarizer 518 acts an analyzer that permits light to pass through to varying degrees, or blocks such light, depending on the linear polarization of the light that has passed through the LC 512 a second time. In some embodiments, the linear polarizer 510 may be omitted. In such cases, the linear polarizer 518 alone may act as an initial polarizer and an analyzer.

In the exemplar state shown in FIG. 5A, light that is incident on the pixel 500 is linearly polarized by the linear polarizer 510 before passing through the transparent substrate 516, the transparent electrode 514, and the LC 512. Illustratively, a voltage to generate an electric field has not been applied via the transparent electrode 514. In the absence of an electric field, molecules in the LC 512 are oriented so as to rotate the polarization of light passing through the LC 512 by, e.g., approximately 90 degrees. The linear polarizer 510 that is cross-polarized with respect to the linear polarizer 510 permits such light whose polarization has been rotated to pass through. As a result, an amplitude of the light is substantially unattenuated. After passing through the linear polarizer 510, the light further passes through the transparent ground 508, the LC 506, and the transparent electrode 504 before being reflected by the reflective substrate 502. Illustratively, a voltage to generate an electric field has not been applied via the transparent electrode 504. In the absence of an electric field, molecules in the LC 512 are vertically aligned and do not substantially change the phase of light passing through the LC 512, or the light that is reflected back through the LC 512 by the reflective substrate 502. The reflected light also maintains a same linear polarization. After passing back through the LC 512, the reflected light further passes back through the transparent ground 508, the linear polarizer 510, the LC 512, the transparent electrode 514, the transparent substrate 516, and the linear polarizer 518. Once again, the LC 512 rotates the linear polarization of the reflected light by, e.g., approximately 90 degrees, and the light whose polarization has been rotated passes through the linear polarizer 518, which does not substantially attenuate an amplitude of the light.

Figure 5B:
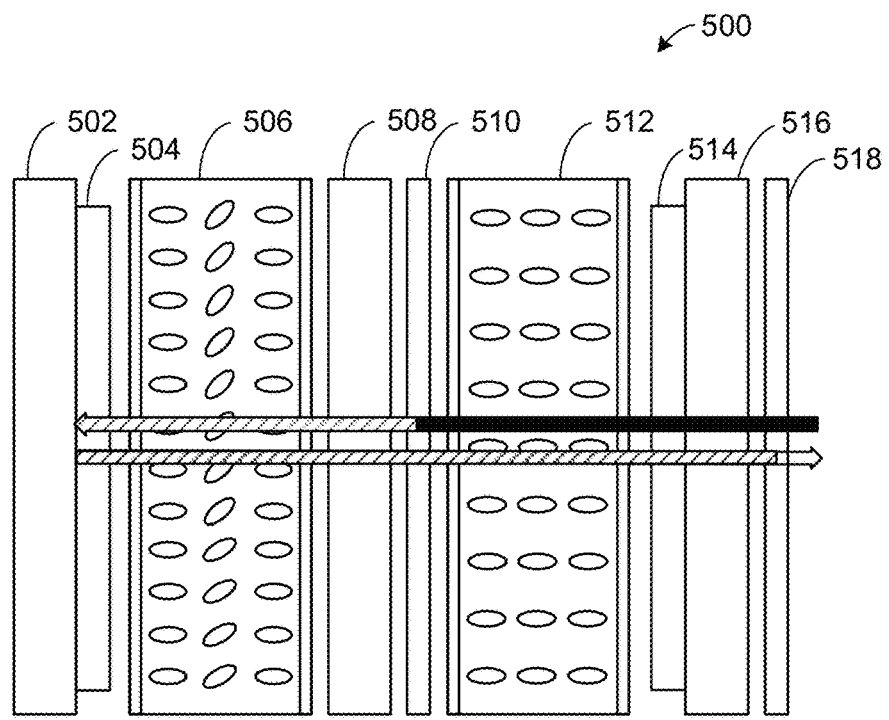
FIG. 5B is a schematic diagram illustrating a cross-section view of the exemplar pixel of FIG. 5A in another state, according to various embodiments.

FIG. 5B is a schematic diagram illustrating a cross-section view of the exemplar pixel 500 of FIG. 5A in another state, according to various embodiments. In the exemplar state shown in FIG. 5B, a voltage has been applied via the electrode 514 to generate an electric field that reorients molecules in the LC 512 to align with the electric field. As a result, light that is incident on the LC 512 is no longer rotated by the LC 512. For example, s polarized light that is output by the linear polarizer 518 could remain s polarized after passing through the LC 512 when the electric field is applied. In such a case, the linear polarizer 510 that is cross-polarized with respect to the linear polarizer 510 blocks the s polarized light output by the LC 512. As another example, the LC 512 could output elliptically polarized light that is primarily s polarized but also include a p polarized component that is noise. In such a case, the linear polarizer 510 could block the s polarized component and permit the p polarized component to pass though. In some embodiments, the configuration shown in FIG. 5A may be associated with an "ON" state of the pixel 500, and the configuration shown in FIG. 5B may be associated with an "OFF" state of the pixel 500, or vice versa. In some embodiments, in-between states may also be generated by applying a smaller voltage than that shown in FIG. 5B to partially reorient molecules in the LC 512. Although a particular reorientation of molecules in the LC 512 is shown for illustrative purposes, it should be understood that, in other embodiments, the reorientation of molecules in a LC may generally depend on the type of LC that is used, including whether the LC has a positive or negative dielectric aniosotropy, and the type of electric field that is generated, including the direction of the electric field.

In the exemplar state shown in FIG. 5B, a voltage has also been applied via the electrode 504 to generate an electric field that reorients molecules in the LC 512 based on the electric field. Although a particular reorientation of molecules in the LC 512 is shown for illustrative purposes, it should be understood that, in other embodiments, the reorientation of molecules in the LC may depend on the type of LC that is used and the type of electric field that is generated. As described, reorientation of the molecules in the LC 506 can cause a phase delay to be introduced to light passing through the LC 506.

In addition, light that has passed through layers of the pixel 500 is reflected by the reflective substrate 502 and passes through the LC 506 again, which introduces an additional phase delay. The reflected light also passes through the linear polarizer 510, the LC 512, and the linear polarizer 518 again. Because molecules in the LC 512 are aligned with an electric field and do not rotate a linear polarization of the reflected light that has passed through the linear polarizer 510, the linear polarizer 518 that is cross-polarized with respect to the linear polarizer 510 blocks the light that has passed through the LC 512. Accordingly, the amplitude of a wavefront of light incident on the pixel 500 is attenuated twice when the pixel 500 is in the exemplar state shown in FIG. 5B. Further, complex modulation, in which amplitude and phase modulation are independently controllable, can be achieved by independently driving the electrodes 504 and 514 of the pixel 500. As described, in some embodiments, the LC 506 can be controlled to modulate a phase of light passing through the LC 506 between 0 and approximately 360 degrees, or a multiple thereof. In such cases, unintended phase modulation produced by the LC 512, if any, can be compensated for using the LC 506. For example, a lookup table could be created to indicate the total phase modulation when the electrodes 504 and 514 are driven to produce various voltages, and the appropriate driving voltage can be chosen to generate a desired phase modulation.

In some embodiments, the pixels of an optical patterning system may include additional, or different, elements than those shown in FIGS. 5A-5B, such as glass layers surrounding the reflective substrate 502 and the alignment layer and 518, one or more spacers, one or more color filters, etc.

Figure 6:
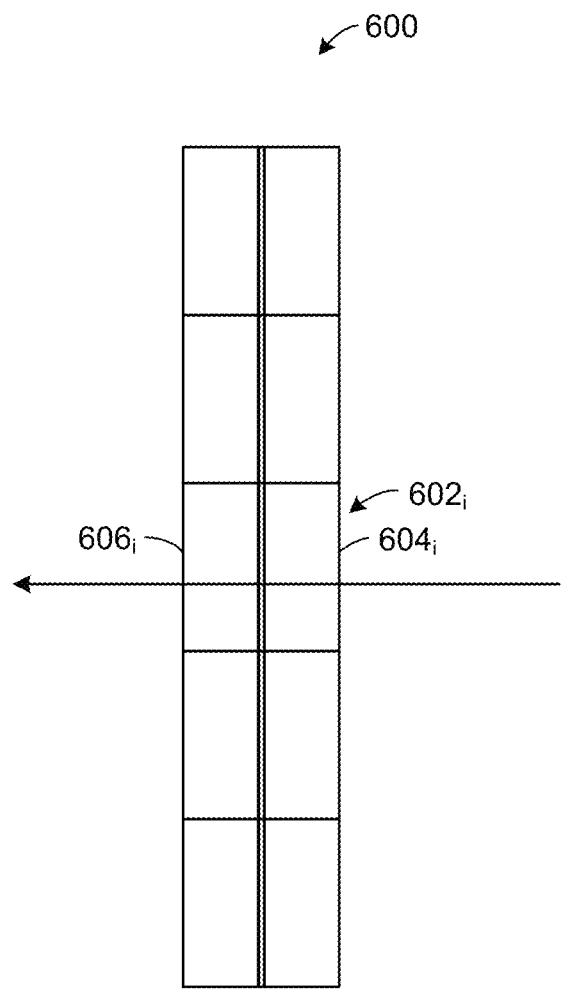
FIG. 6 is a schematic diagram illustrating a cross-section view of another optical patterning system, according to various embodiments.

FIG. 6 is a schematic diagram illustrating a cross-section view of another optical patterning system, according to various embodiments. As shown, the optical patterning system 600 includes an array of pixels $602_i$ (collectively referred to as pixels 602 and individually referred to as pixel 602) that are formed by LC cells. Any suitable number of pixels may be included in the optical patterning system 600.

In some embodiments, dividers are not required between pixels or cells, although dividers may be used in other embodiments.

As shown, each of the pixels 602 includes a respective amplitude-modulating cell $604_i$ (collectively referred to as amplitude-modulating cells 604 and individually referred to as amplitude-modulating cell 604) that is in line with a phase-modulating cell $606_i$ (collectively referred to as phase-modulating cells 606 and individually referred to as phase-modulating cell 606). In some embodiments, the amplitude-modulating cells 604 are similar to the amplitude-modulating cells 404, described above in conjunction with FIG. 4. In addition, the phase-modulating cells 606 may be similar to the phase cells 406, described above in conjunction with FIG. 4, except that the phase modulating cells 606 are transmissive rather than reflective. In some embodiments, the relative positions of the amplitude-modulating cells and the phase-modulating cells may be switched from the positions shown in FIG. 6.

As shown, a light beam that is incident on the amplitude-modulating cells 604 passes through both the amplitude-modulating cells 604 and the phase-modulating cells 606. The light beam can be attenuated once by the amplitude-modulating cells 604, rather than twice as with the amplitude-modulating cells 406 of the optical patterning system 400.

In some embodiments, the amplitude-modulating cell 404 can include any technically feasible elements that modulate the amplitude of a wavefront of light, or the amplitude and phase of the wavefront. In addition, the phase-modulating cells 406 can include any technically feasible elements that modulate the phase of a wavefront of light. In other embodiments, the phase-modulating cells 406 may also modulate the amplitude of a wavefront of light, in addition to modulating the phase. The elements of an exemplar amplitude-modulating cell and phase-modulating cell are described below in conjunction with FIGS. 7A-7B.

Similar to the phase-modulating cells 406, the phase-modulating cells 606 permit phase modulation between 0 and approximately 360 degrees, or a multiple thereof, in some embodiments. In such cases, any unintended phase modulation by the amplitude-modulating cells 404 can be compensated for using the phase-modulating cells 606. For example, a lookup table could be created to indicate the total phase modulation when a phase-modulating cell 606 and a corresponding amplitude-modulating cell 604 are driven with various voltages. The driving voltages required to produce a desired phase modulation can then be determined using such a lookup table. In some embodiments in which the phase-modulating cells 606 also modulate amplitude, a lookup table may be created that indicates the total amplitude and phase modulation when an amplitude-modulating cell 404 and a corresponding phase-modulating cell 406 are driven with various voltages. The driving voltages required to produce a desired amplitude and phase modulation can then be determined using such a lookup table.

In contrast to the amplitude-modulating cells 404, the amplitude-modulating cells 604 can be driven with voltages that are proportional to desired levels of brightness, rather than with voltages that are square roots of the desired levels of brightness. In a voltage-brightness gamma curve, the brightness modulation at the amplitude-modulating cells 604 is proportional to the desired level of brightness modulation of the optical patterning system 600. By using the amplitude-modulating cells 604 in conjunction with the phase-modulating cells 606, the optical patterning system 600 permits complex wavefront modulation in which amplitude and phase modulation of a wavefront of light are independently controllable. In some embodiments, amplitude and phase modulation are independently controlled via the amplitude-modulating cells 604 and the phase-modulating cells 606, respectively, or via a combination of the amplitude-modulating cells 604 and the phase-modulating cells 606. In some embodiments, the optical patterning system 600 can be used to modulate light emitted by a coherent light source, such as a laser, to generate a hologram. In other embodiments, the optical patterning system 600 may be used in video or image projection, optical correlation, wavelength selective switching, diffractive optical components, or any other suitable applications.

Figure 7A:
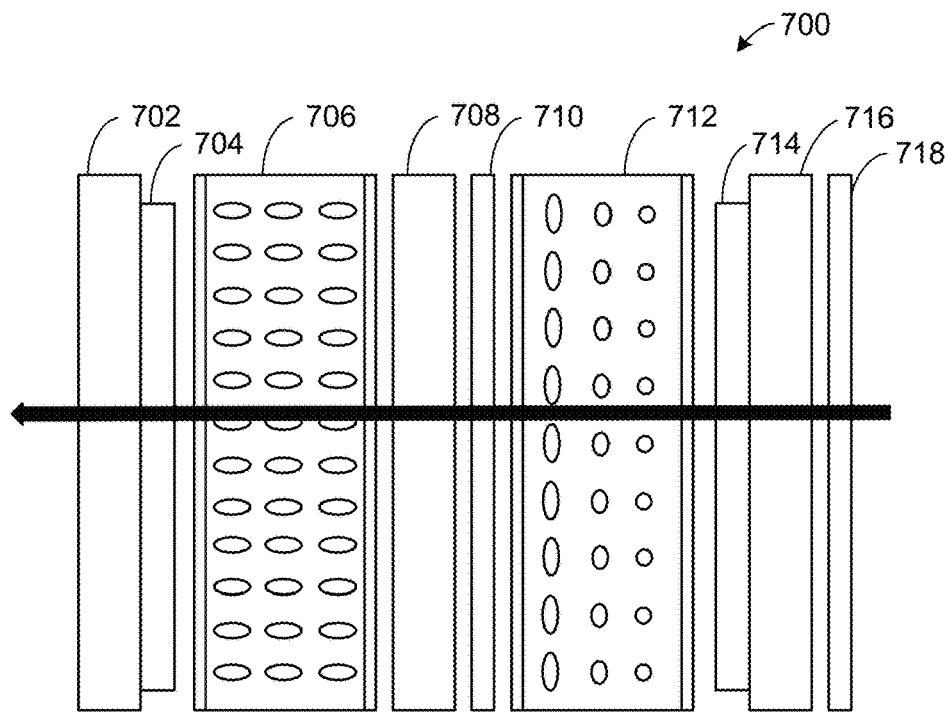
FIG. 7A is a schematic diagram illustrating a cross-section view of another exemplar pixel in one state, according to various embodiments.

FIG. 7A is a schematic diagram illustrating a cross-section view of an exemplar pixel 700 of the optical patterning system 600 in one state, according to various embodiments. All or some of the components of the pixel 700 may be in physical contact with one another, share a substrate with one another, laminated with one another, optically in contact with one another, have index matching fluid or optical glue between one another, and/or may have space therebetween.

As shown, the pixel 700 includes an electrode 704, a LC 706, and a transparent ground 708, which are similar to the electrode 504, the LC 506, and the transparent ground 508, respectively, of the pixel 500 described above in conjunction with FIGS. 5A-5B. However, the pixel 700 includes a transparent substrate 702, rather than the reflective substrate 500 of the pixel 500. For example, the transparent substrate 702 could be constructed from glass or any other suitable transparent material. The electrode 504 and the transparent ground 508 may also be constructed from any technically feasible materials, such as those described above in conjunction with FIGS. 5A-5B, and have any suitable thickness. Together, the transparent substrate 702, the electrode 704, and the transparent ground 708 form a phase-modulating cell, corresponding to one of the phase-modulating cells 606 described above in conjunction with FIG. 6.

As shown, the pixel 700 also includes a linear polarizer 710, a LC 712, a transparent electrode 714, another transparent substrate 716, and another linear polarizer 718, which are similar to the linear polarizer 510, the LC 512, the transparent electrode 514, the transparent substrate 516, and the linear polarizer 518, respectively, of the pixel 500 and can be constructed from any technically feasible materials, such as those described above in conjunction with FIGS. 5A-5B, and have any suitable thickness. Together, the transparent ground 708, the linear polarizers 710 and 718, the LC 712, the transparent electrode 714, and the transparent substrate 716 form an amplitude-modulating cell, corresponding to one of the amplitude-modulating cells 604 described above in conjunction with FIG. 6. Such an amplitude-modulating cell shares the transparent ground 708 with the phase-modulating cell, described above. Similar to the transparent ground 508, the transparent ground 708 can separate electric fields produced by independently driving the transparent electrode 704 and the transparent electrode 714. Accordingly, cross-talk can be substantially eliminated, i.e., the electric fields do not substantially interfere with each other. In other embodiments, the amplitude-modulating cell and the phase-modulating cell may include separate transparent grounds.

In some embodiments, the linear polarizers 710 and 718 are cross-polarized, and the LC 712 is a TN LC. In other embodiments, any LC including properties that permit amplitude modulation, such as a variation of the TN LC (e.g., a super-twisted nematic LC), a PA LC such as those used in in-plane switching devices, a VA LC, etc. may be used.

In the exemplar state shown in FIG. 7A, light that is incident on the pixel 700 is linearly polarized by the linear polarizer 710 before passing through the transparent substrate 716, the transparent electrode 714, and the LC 712. Illustratively, a voltage to generate an electric field has not been applied via the transparent electrode 714. In the absence of an electric field, molecules in the LC 712 are oriented so as to rotate the polarization of light passing through the LC 712 by, e.g., approximately 90 degrees. Similar to the LC 512, the LC 712 may produce some noise and output elliptically polarized light in some embodiments. The linear polarizer 570 that is cross-polarized with respect to the linear polarizer 710 permits light whose polarization has been rotated to pass through and blocks orthogonally polarized light. As a result, an amplitude of light is not substantially attenuated in the exemplar state shown in FIG. 7A. After passing through the linear polarizer 710, the light further passes through the transparent ground 708, the LC 706, the transparent electrode 704, and the transparent substrate 702. Illustratively, a voltage to generate an electric field has not been applied via the transparent electrode 704. In the absence of an electric field, molecules in the LC 712 are vertically aligned and do not substantially change the phase of light passing through the LC 712. Accordingly, in the exemplar state shown in FIG. 7A, light passes through the various layers of the pixel 700 with substantially unchanged amplitude and phase.

Figure 7B:
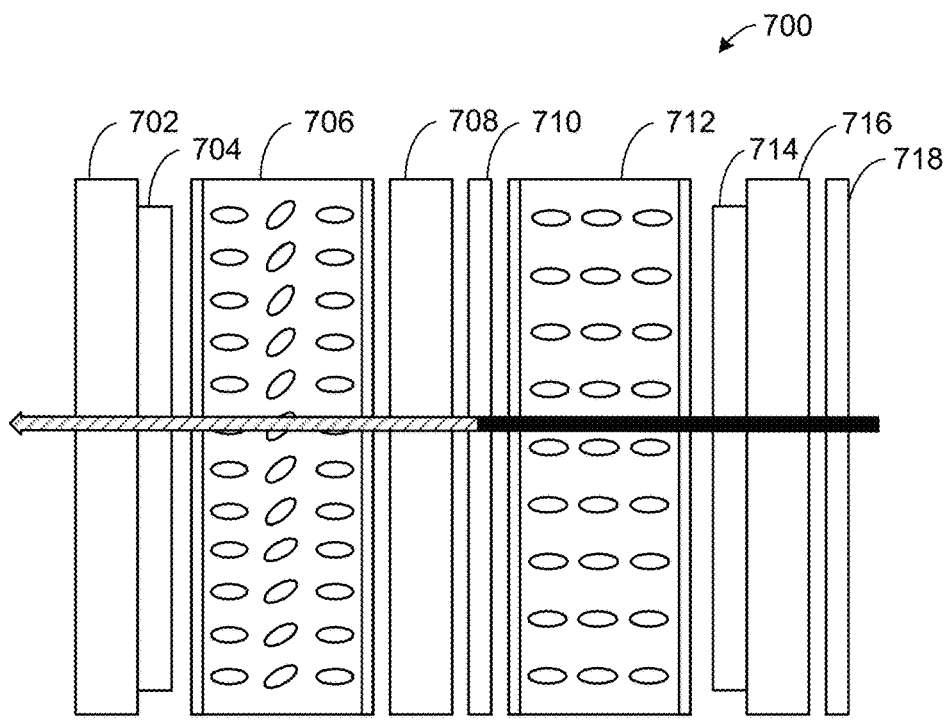
FIG. 7B is a schematic diagram illustrating a cross-section view of the exemplar pixel of FIG. 7A in another state, according to various embodiments.

FIG. 7B is a schematic diagram illustrating a cross-section view of the exemplar pixel of FIG. 7A in another state, according to various embodiments. In the exemplar state shown in FIG. 7B, a voltage has been applied via the electrode 714 to generate an electric field that reorients molecules in the LC 712 to align with the electric field. As a result, a linear polarization of light that is incident on the LC 712 is no longer rotated by the LC 712. In such a case, the linear polarizer 710 that is cross-polarized with respect to the linear polarizer 710 substantially blocks the linear polarization of light output by the LC 712 (or the elliptically polarized light in some embodiments). In some embodiments, the configuration shown in FIG. 7A may be associated with an "ON" state of the pixel 700, and the configuration shown in FIG. 7B may be associated with an "OFF" state of the pixel 700, or vice versa. In some embodiments, in-between states may also be generated by applying a smaller voltage than that shown in FIG. 7B to partially reorient molecules in the LC 712. Although a particular reorientation of molecules in the LC 712 is shown for illustrative purposes, it should be understood that, in other embodiments, the reorientation of molecules in a LC may generally depend on the type of LC that is used, including whether the LC has a positive or negative dielectric aniosotropy, and the type of electric field that is generated, including the direction of the electric field.

In the exemplar state shown in FIG. 7B, a voltage has also been applied via the electrode 704 to generate an electric field that reorients molecules in the LC 712 based on the electric field. Although a particular reorientation of molecules in the LC 712 is shown for illustrative purposes, it should be understood that, in other embodiments, the reorientation of molecules in a LC may depend on the type of LC that is used and the type of electric field that is generated. As described, reorientation of the molecules in the LC 706 can cause a phase delay to be introduced to light passing through the LC 706.

The pixel 700 permits complex modulation in which modulation of the amplitude and phase of a wavefront of light are independently controllable. In particular, complex modulation can be achieved by independently driving the electrodes 704 and 714 of the pixel 700. Similar to the description above in conjunction with FIG. 5B, in some embodiments, the LC 706 can be controlled to modulate the phase of light passing through the LC 706 between 0 and approximately 360 degrees, or a multiple thereof. In such cases, unintended phase modulation produced by the LC 712, if any, can be compensated for using the LC 706. For example, a lookup table could be created to indicate the total phase modulation when the electrodes 704 and 714 are driven to produce various voltages, and the appropriate driving voltage can be chosen to generate a desired phase modulation. In contrast to the pixel 500 described above in conjunction with FIGS. 5A-5B, light is not reflected back through the layers of the pixel 700. As a result, in the exemplar state shown in FIG. 7B, light passing through the pixel 700 is at most attenuated once.

In some embodiments, the pixels of an optical patterning system may include additional, or different, elements than those shown in FIGS. 7A-7B, such as glass layers surrounding the reflective substrate 702 and the alignment layer and 718, one or more spacers, one or more color filters, etc.

Figure 8:
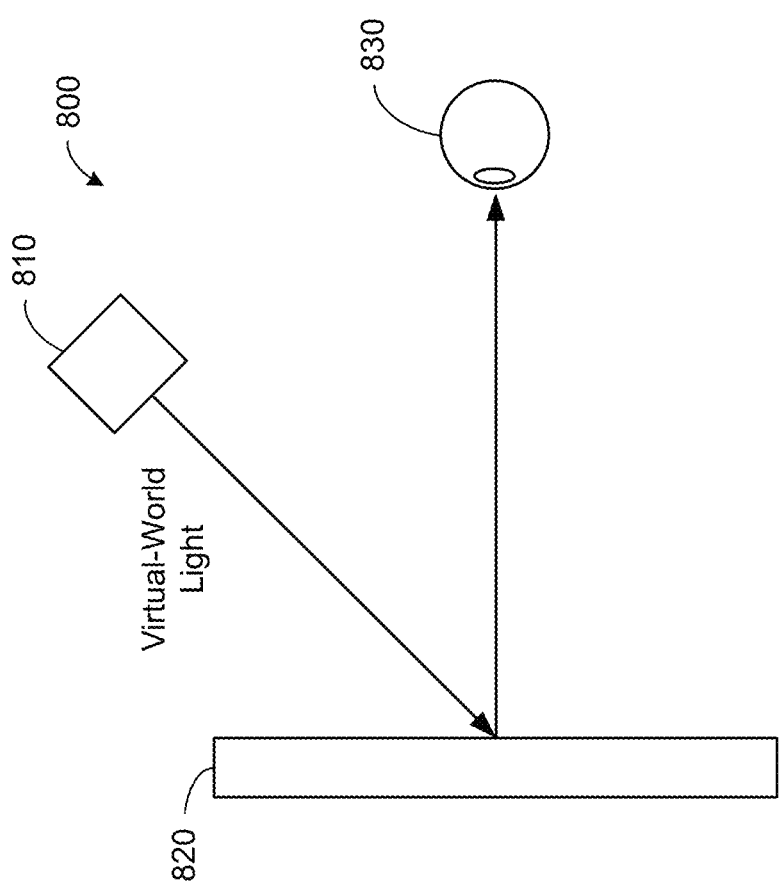
FIG. 8 is a schematic diagram illustrating a portion of a virtual reality optical system that includes an optical patterning system, according to various embodiments.
Figure 9:
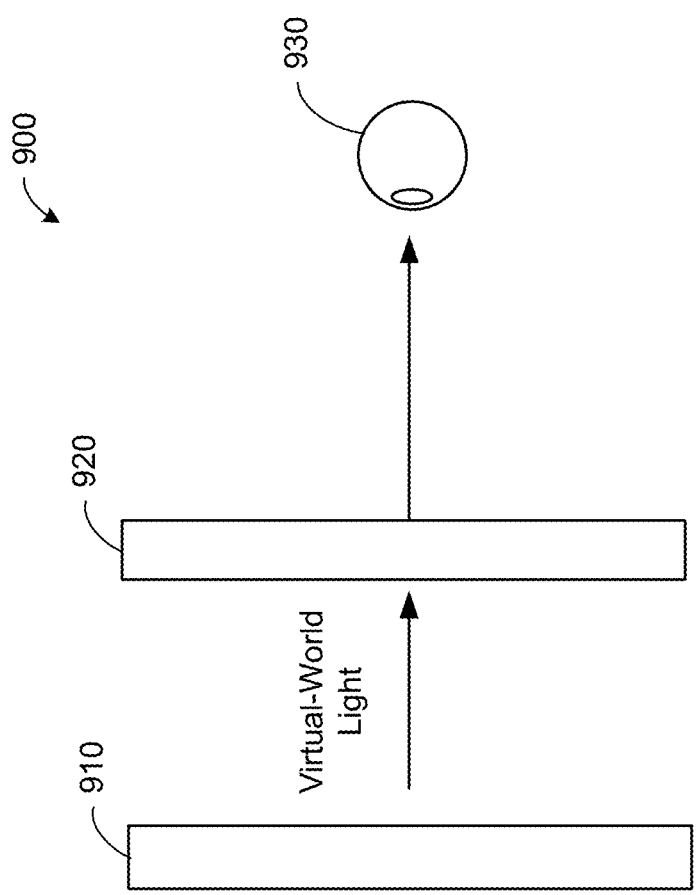
FIG. 9 is a schematic diagram illustrating a portion of another virtual reality optical system that includes an optical patterning system, according to various embodiments.
Figure 10:
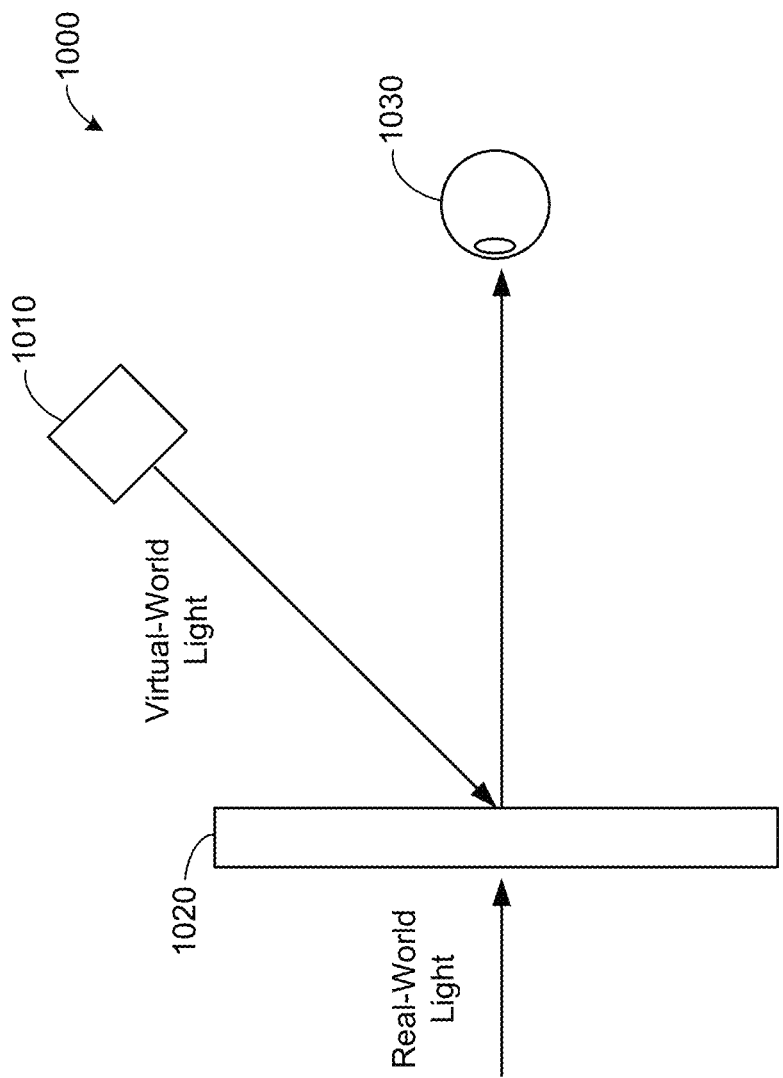
FIG. 10 is a schematic diagram illustrating a portion of an augmented reality optical system that includes an optical patterning system, according to various embodiments.

FIGS. 8-10 illustrate example optical system configurations that include one or more optical patterning systems, according to various embodiments. Such systems may be included in, for example, near-eye display devices for virtual reality (VR), augmented reality (AR), or mixed reality (MR), such as the NED system 100 or the HMD 162 described above with respect to FIGS. 1A-1B and 2A-2B, respectively. Although particular optical systems are disclosed herein as reference examples, the optical patterning systems disclosed herein may generally be included in any suitable optical systems. In various embodiments, an optical system for an AR, VR, and MR near-eye display device is configured to process virtual-world light, which is generated by a light source driven by an application (e.g., one of the applications stored in the application store 355 described above with respect to FIG. 3) executed by a computer processor. The optical system may process such virtual light to form an image at an exit pupil of the optical system, which may coincide with a location of an eye of a user of the NED device.

In various embodiments, an optical system for an AR and MR near-eye display device is configured to process real-world light. Unlike the case for virtual-world light, such an optical system need not introduce optical power to the image of the real-world light at the exit pupil and need not change the location of the exit pupil for the real-world light in response to a change in the location (and/or orientation) of the eye with respect to the optical system. Accordingly, real-world light and virtual-world light, though co-located in portions of the optical system, are, at least in some embodiments, processed differently from one another by the optical system.

FIG. 8 is a schematic diagram illustrating a portion of a virtual reality optical system 800 that includes an optical patterning system, according to various embodiments. For example, the optical system 800 could be included in a virtual reality NED. As shown, the optical system 800 includes a light source 810 and an optical patterning system 820.

The light source 810 is configured to project a beam of light onto the optical patterning system 820. In some embodiments, the light source 810 may include a coherent light source. Examples of coherent light sources include lasers and certain LEDS, sLEDs, and mLEDs, or some combination thereof. Any technically feasible light source may be used, and the type of light source that is used will generally depend on the application. For example, a coherent light source could be used to create holograms.

In some embodiments, the optical patterning system 820 may be the reflective optical patterning system 400 described above with respect to FIGS. 4 and 5A-5B. For example, in some embodiments, the optical patterning system 820 may be a spatial light modulator that can be driven to modulate coherent light emitted by the light source 810 to form holograms. In other embodiments, the optical patterning system 820 may be used in any suitable applications, such as video or image projection.

In some embodiments, the optical system 800 may include additional components that are not shown, such as a lens or other optical element(s) that focus light at an exit pupil 830 of the optical system 800, an eye tracking module to provide eye position information to a controller module, optical element(s) to steer the exit pupil 830 to different locations according to an eye gaze angle, etc. For example, a rift lens, PBP lens, pancake lens, etc. could be used to focus light at the exit pupil 830. As another example, an eye tracking module could be located at any of a number of locations within or on a NED. That is, embodiments may include any technically feasible configuration of a VR optical system that includes an optical patterning system according to techniques disclosed herein.

FIG. 9 is a schematic diagram illustrating a portion of another virtual reality optical system 900 that includes an optical patterning system, according to various embodiments. For example, the optical system 900 could be included in a virtual reality NED. As shown, the optical system 900 includes a light source 910 and an optical patterning system 920.

Similar to the light source 810 described above, the light source 910 may include, e.g., a coherent light source such as a laser, LED, sLED, or mLED that projects a beam of light onto the optical patterning system 920.

In contrast to the optical patterning system 820, the optical patterning system 920 transmits light incident thereon from the light source 910. In some embodiments, the optical patterning system 920 may be the transmissive optical patterning system 600 described above with respect to FIGS. 6 and 7A-7B. For example, in some embodiments, the optical patterning system 920 may be a spatial light modulator that can be driven to modulate coherent light emitted by the light source 910 to form holograms. In other embodiments, the optical patterning system 920 may be used in any suitable applications, such as video or image projection.

Similar to the discussion above with respect to the optical system 800, the optical system 900 may include additional components that are not shown, such as a lens or other optical element(s) that focus light at an exit pupil 930 of the optical system 900, an eye tracking module to provide eye position information to a controller module, optical element(s) to steer the exit pupil 930 to different locations according to an eye gaze angle, etc.

FIG. 10 is a schematic diagram illustrating a portion of an augmented reality optical system 1000 that includes an optical patterning system, according to various embodiments. For example, the optical system 1000 may be included in an augmented reality NED. The optical system 1000 is different from the optical systems 800 and 900 in a number of ways. For example, the optical systems 800 and 900 are configured to operate with virtual-world light, whereas the optical system 1000 is configured to operate with virtual-world light and real-world light.

As shown, the optical system 1000 includes a light source 1010 and an optical patterning system 1020. Similar to the light source 810 described above, the light source 1010 may include, e.g., a coherent light source such as a laser, LED, sLED, or mLED that projects a beam of light onto the optical patterning system 1020.

Illustratively, the optical patterning system 1020 works in a reflective mode that is transparent to real-world light and combines the real-world light with a virtual image generated using the light source 1010. For example, in some embodiments, the optical patterning system 1020 may be similar to the optical patterning system 400 described above with respect to FIGS. 4 and 5A-5B, except the reflective substrate 520 is replaced by a transflective substrate that is partially reflective and partially transmissive. Similar to the discussion above with respect to the optical patterning system 920, in some embodiments, the optical patterning system 1020 may be a spatial light modulator that can be driven to modulate coherent light emitted by the light source 1010 to form holograms. In other embodiments, the optical patterning system 1020 may be used in any suitable applications, such as video or image projection.

In some embodiments, the optical system 1000 may further include a prism, waveguide optical system, or other optical element(s) that redirect and/or focus light from the light source 1010 to the exit pupil position 1030. In such cases, an optical patterning system may (or may not) be located differently in the optical system than the optical patterning system 1020 shown in FIG. 10. In some embodiments, the optical system 1000 may also include other components that are not shown, such as a lens or other optical element(s) that focus light at an exit pupil 1030 of the optical system 1000, an eye tracking module to provide eye position information to a controller module, optical element(s) to steer the exit pupil 1030 to different locations according to an eye gaze angle, etc. That is, embodiments may include any technically feasible configuration of an AR optical system that includes an optical patterning system according to techniques disclosed herein.

Figure 11:
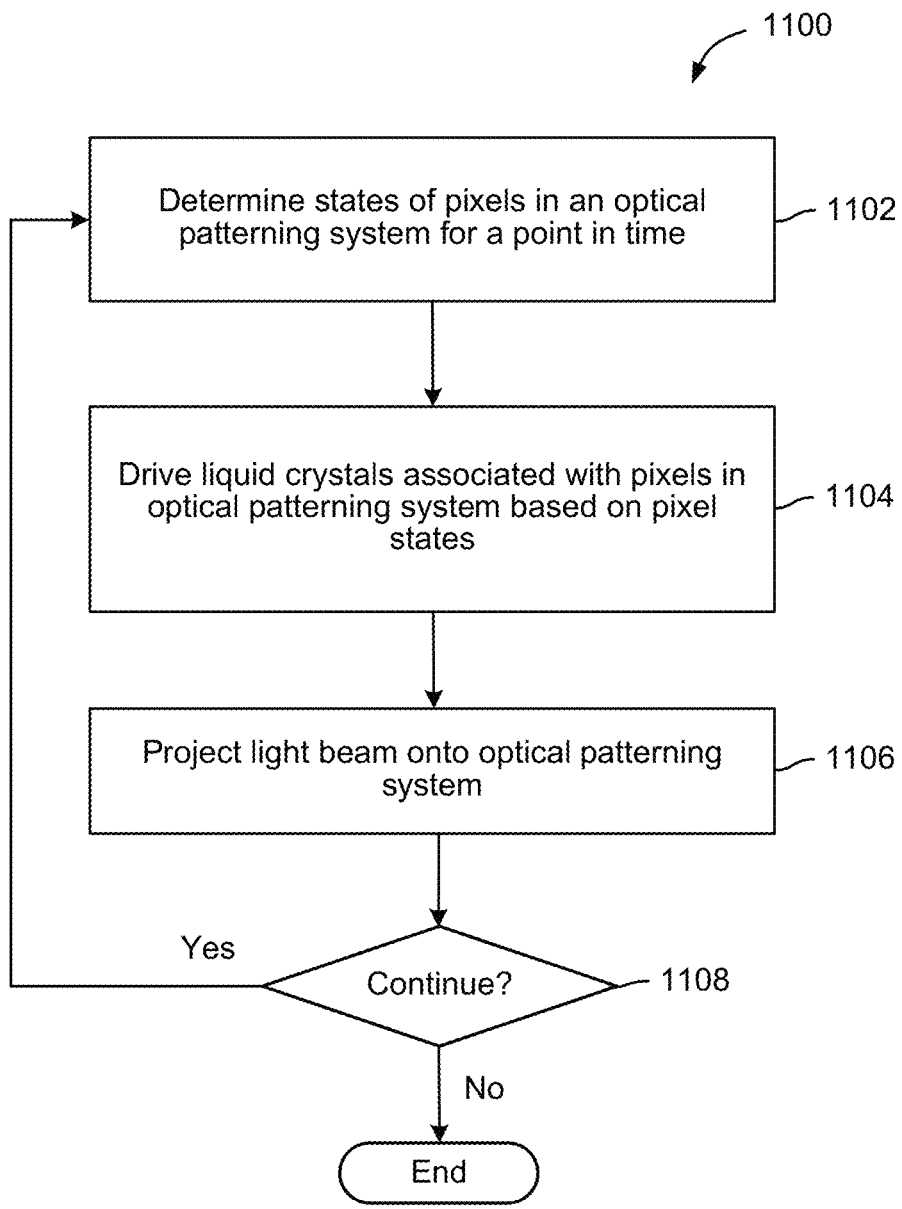
FIG. 11 is a flow diagram illustrating a method for modulating a beam of light, according to various embodiments.

FIG. 11 is a flow diagram illustrating a method for modulating a beam of light, according to various embodiments. Although the method steps are described with reference to the systems of FIGS. 1-10, persons skilled in the art will understand that any system may be configured to implement the method steps, in any order, in other embodiments.

As shown, a method 1100 begins at step 1102, where an application determines the states of pixels of an optical patterning system for a point in time. The application may be, e.g., one of the applications stored in the application store 355, which as described above with respect to FIG. 3 may include gaming applications, conferencing applications, video playback applications, or any other suitable applications. In some embodiments, the application may determine pixels of an optical patterning system to turn ON and OFF, and/or in-between states for the pixel, at step 1102.

The state of each pixel that is determined by the application at step 1102 may be associated with an amplitude change and/or a phase delay in a wavefront of light that is incident on that pixel. Further, the pixel states that are determined at step 1102 may generally depend on the dynamic optics application. For example, the application may solve holography equations and use the look-up tables described above in conjunction with FIGS. 4, 5A-5B, 6, and 7A-7B to determine pixel states needed to generate a hologram from light emitted by a coherent light source. Any other suitable pixel states may be determined for other dynamic optics applications.

At step 1104, the application causes liquid crystals associated with the pixels in the optical patterning system to be driven based on the determined pixel states. Doing so may reorient the anisotropic molecules of LCs that are associated with the pixels. For example, the controller could determine drive voltages required to achieve the determined pixel states and cause those voltages to be generated via electrodes (e.g., the electrodes 504 and 514 or 704 and 714), as described above with respect to FIGS. 5A-5B and 7A-7B. In some embodiments in which the optical patterning system is reflective (e.g., the optical patterning system 400 described above in conjunction with FIGS. 4 and 5A-5B) or transflective, the driving voltages are proportional to square roots of the desired levels of brightness. In other embodiments in which the optical patterning system is transmissive (e.g., the optical patterning system 600 described above in conjunction with FIGS. 6 and 7A-7B), the electrodes can be driven with voltages that are proportional to desired levels of brightness.

At step 1106, the application causes a light beam to be projected onto the optical patterning system. The optical patterning system imposes a spatially varying modulation on such a light beam. In particular, the amplitude and phase of light passing through or reflected by pixels in the optical patterning system will be modulated differently for pixels having different states. As a result, the optical patterning system may, e.g., be used to encode a coherent light beam from a light source with a pattern output to form holograms, as described above, or in any other suitable application. In some embodiments, such as the optical patterning system 400 described above with respect FIGS. 4 and 5A-5B, the optical patterning system may reflect the modulated light. In other embodiments, such as the optical patterning system 600 described above with respect to FIGS. 6 and 7A-7B, the optical patterning system may transmit the modulated light.

At step 1108, the application determines whether to continue to another point in time. If the application determines to continue, then the method 1100 returns to step 1102, where the application determines the states of pixels of the optical patterning system for a next point in time. On the other hand, if the application determines not to continue, then the method 1100 ends.

One advantage of the techniques disclosed herein is greater optical efficiency and lower noise relative to complex wavefront modulation systems that combine pairs of pixels into super pixels using filters. In addition, the techniques disclosed herein can be used to generate relatively high quality holograms. These technical advantages represent one or more technological advancements over prior art approaches.

1. In some embodiments, an optical patterning system comprises a plurality of pixels, each of the pixels comprising a first liquid crystal cell that modulates at least an amplitude of light, and a second liquid crystal cell that modulates at least a phase of the light, wherein the first liquid crystal cell is in line with the second liquid crystal cell.

2. The optical patterning system of clause 1, wherein the first liquid crystal cell and the second liquid crystal cell share a transparent ground.

3. The optical patterning system of clauses 1 or 2, wherein the first liquid crystal cell comprises a twisted nematic liquid crystal and a transparent electrode.

4. The optical patterning system of any of clauses 1-3, wherein the second liquid crystal cell comprises a vertically-aligned liquid crystal and a transparent electrode.

5. The optical patterning system of any of clauses 1-4, wherein the first liquid crystal cell comprises a linear polarizer.

6. The optical patterning system of any of clauses 1-5, wherein the first liquid crystal cell comprises a first linear polarizer and a second linear polarizer, and the first linear polarizer is cross-polarized with respect to the second linear polarizer.

7. The optical patterning system of any of clauses 1-6, wherein the second liquid crystal cell comprises a reflective substrate, and the first liquid crystal cell is driven via a voltage based on a square root of a target level of brightness.

8. The optical patterning system of any of clauses 1-7, wherein the second liquid crystal cell comprises a transmissive substrate, and the first liquid crystal cell is driven via a voltage based on a target level of brightness.

9. The optical patterning system of any of clauses 1-8, wherein the optical patterning system is used in computer-generated holography.

10. The optical patterning system of any of clauses 1-9, wherein the optical patterning system is included in a near eye display device.

11. In some embodiments, a cell comprises a first liquid crystal cell that modulates at least an amplitude of light, and a second liquid crystal cell that is in line with the first liquid crystal cell and modulates at least a phase of the light.

12. The cell of clause 11, wherein the first liquid crystal cell and the second liquid crystal cell share a transparent ground.

13. The cell of clauses 11 or 12, wherein the first liquid crystal cell comprises a twisted nematic liquid crystal, a transparent electrode layered on a substrate, and at least one linear polarizer.

14. The cell of any of clauses 11-13, wherein the at least one linear polarizer comprises a first linear polarizer that is cross-polarized with respect to a second linear polarizer.

15. The cell of any of clauses 11-14, wherein the second liquid crystal cell comprises a vertically-aligned liquid crystal and a transparent electrode layered on a substrate.

16. The cell of any of clauses 11-15, wherein the substrate is transparent.

17. The cell of any of clauses 11-16, wherein the substrate is either reflective or transflective.

18. In some embodiments, a computer-implemented method for modulating light comprises determining states of a plurality of pixels for at least one point in time, driving each pixel included in the plurality of pixels based on a corresponding state, wherein driving the pixel comprises driving a first liquid crystal cell to modulate at least an amplitude of light, and driving a second liquid crystal cell to modulate at least a phase of the light, wherein the first liquid crystal cell is in line with the second liquid crystal cell, and projecting a light beam that is incident on the plurality of pixels.

19. The method of clause 18, further comprising passing the light beam through a transparent ground shared by the first liquid crystal cell and the second liquid crystal cell.

20. The method of clauses 18 or 19, wherein the second liquid crystal cell comprises a reflective substrate, and the first liquid crystal cell is driven via a voltage based on a square root of a target level of brightness.

Any and all combinations of any of the claim elements recited in any of the claims and/or any elements described in this application, in any fashion, fall within the contemplated scope of the present disclosure and protection.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

The descriptions of the various embodiments have been presented for purposes of illustration, but are not intended to be exhaustive or limited to the embodiments disclosed. Many modifications and variations is apparent to those of ordinary skill in the art without departing from the scope and spirit of the described embodiments.

Aspects of the present embodiments may be embodied as a system, method, or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It is understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for modulating light, the method comprising:
    determining states of a plurality of pixels for at least one point in time;
    driving each pixel included in the plurality of pixels based on a corresponding state,
    wherein driving the pixel comprises:
        driving a first liquid crystal cell, using a first electrode on a first side of the liquid crystal cell, to modulate at least an amplitude of light, and
        driving a second liquid crystal cell, using a second electrode, to modulate at least a phase of the light,
    wherein the first liquid crystal cell is in line with the second liquid crystal cell, the second liquid crystal cell is on a second side of the first liquid crystal cell opposite the first side, and the second electrode is on an opposite side of the second liquid crystal cell than the first electrode;
    passing the light beam through a ground shared by the first liquid crystal cell and the second liquid crystal cell; and
    projecting a light beam that is incident on the plurality of pixels.

2. The method of claim 1, wherein the ground is a transparent ground comprising indium tin oxide (ITO).

3. The method of claim 1, wherein the second liquid crystal cell comprises a reflective substrate, and the first liquid crystal cell is driven via a voltage based on a square root of a target level of brightness.

4. The method of claim 1, wherein the first liquid crystal cell comprises a twisted nematic liquid crystal and the first electrode is a transparent electrode.

5. The method of claim 1, wherein the second liquid crystal cell comprises a vertically-aligned liquid crystal and the second electrode is a transparent electrode.

6. The method of claim 1, wherein the first liquid crystal cell comprises a linear polarizer.

7. The method of claim 1, wherein the first liquid crystal cell comprises a first linear polarizer and a second linear polarizer, and the first linear polarizer is cross-polarized with respect to the second linear polarizer.

8. The method of claim 1, wherein the second liquid crystal cell comprises a reflective substrate, and the first liquid crystal cell is driven via a voltage based on a square root of a target level of brightness.

9. The method of claim 1, wherein the second liquid crystal cell comprises a transmissive substrate, and the first liquid crystal cell is driven via a voltage based on a target level of brightness.

10. A computer-implemented method for modulating light, the method comprising:
    determining states of a plurality of pixels for at least one point in time;
    driving each pixel included in the plurality of pixels based on a corresponding state, wherein driving the pixel comprises:
   driving a first liquid crystal cell to modulate at least an amplitude of light, and
   driving a second liquid crystal cell to modulate at least a phase of the light,
wherein the first liquid crystal cell is in line with the second liquid crystal cell;
projecting a light beam that is incident on the plurality of pixels; and
passing the light beam through a transparent ground shared by the first liquid crystal cell and the second liquid crystal cell.

11. A computer-implemented method for modulating light, the method comprising:
determining states of a plurality of pixels for at least one point in time;
driving each pixel included in the plurality of pixels based on a corresponding state,
wherein driving the pixel comprises:
   driving a first liquid crystal cell to modulate at least an amplitude of light, and
   driving a second liquid crystal cell to modulate at least a phase of the light,
wherein the first liquid crystal cell is in line with the second liquid crystal cell, and wherein the first liquid crystal cell and the second liquid crystal cell share a transparent ground; and
projecting a light beam that is incident on the plurality of pixels.

* * * * *